(12) United States Patent
Yao et al.

(10) Patent No.: US 12,212,377 B2
(45) Date of Patent: Jan. 28, 2025

(54) IDENTIFYING SIGNAL INTERFERENCE SOURCES

(71) Applicant: DISH Wireless L.L.C., Englewood, CO (US)

(72) Inventors: Kevin Yao, Cheyenne, WY (US); Bill Versteeg, Buford, GA (US)

(73) Assignee: DISH Wireless L.L.C., Englewood, CO (US)

( * ) Notice: Subject to any disclaimer, the term of this patent is extended or adjusted under 35 U.S.C. 154(b) by 0 days.

(21) Appl. No.: 18/545,490

(22) Filed: Dec. 19, 2023

(65) Prior Publication Data

US 2024/0121020 A1 Apr. 11, 2024

Related U.S. Application Data

(63) Continuation of application No. 17/455,329, filed on Nov. 17, 2021, now Pat. No. 11,888,542, which is a
(Continued)

(51) Int. Cl.
*H04B 17/345* (2015.01)
*H03G 3/20* (2006.01)
(Continued)

(52) U.S. Cl.
CPC ............ *H04B 17/345* (2015.01); *H03G 3/20* (2013.01); *H04B 1/1027* (2013.01);
(Continued)

(58) Field of Classification Search
CPC .... H04B 1/1027; H04B 1/1036; H04B 17/21; H04B 17/318; H04B 17/345; H03G 3/20; H04L 67/12
See application file for complete search history.

(56) References Cited

U.S. PATENT DOCUMENTS 9,026,057 B2 * 5/2015 Jagger ................... H04B 7/005
455/63.1
10,720,947 B1 * 7/2020 Regadamilli ........ H04B 1/1027
(Continued)

FOREIGN PATENT DOCUMENTS

EP 3001717 A1 3/2016
EP 4079022 7/2022
(Continued)

OTHER PUBLICATIONS

EP20839479.1, Response to Rule 71(3) Communication, Jun. 10, 2024.
(Continued)

*Primary Examiner* — Quochien B Vuong
(74) *Attorney, Agent, or Firm* — Wash Park IP Ltd.; John T Kennedy

(57) ABSTRACT

Devices, systems and processes for identifying and detecting an interfering signal are described. A process may include conducting a scan of one or more frequency bands to obtain at least one scan result and determining therefrom if a response condition has been detected. If so detected, a first frequency band corresponding to the detected response condition may be identified and a response condition action to be performed determined. If no response condition action is to be performed, scanning continues. If a response condition is to be performed two or more available sensors are identified and a first sensor is selected. A scan plan is developed and then initiated by the first sensor. Data from the first sensor is received and analyzed to identify a second frequency band indicative of an interfering signal. Based on at least the scan data, a location for a signal interference source (SIS) may be estimated.

20 Claims, 11 Drawing Sheets

Related U.S. Application Data continuation of application No. 16/718,324, filed on Dec. 18, 2019, now Pat. No. 11,201,682.

(51) Int. Cl.
| | |
|---|---|
| *H04B 1/10* | (2006.01) |
| *H04B 17/318* | (2015.01) |
| *H04L 67/12* | (2022.01) |
| *H04B 17/21* | (2015.01) |

(52) U.S. Cl.
CPC ......... *H04B 1/1036* (2013.01); *H04B 17/318* (2015.01); *H04L 67/12* (2013.01); *H04B 17/21* (2015.01)

(56) References Cited

U.S. PATENT DOCUMENTS

| | | | |
|---|---|---|---|
| 2010/0073219 A1 | 3/2010 | He | |
| 2013/0084821 A1 | 4/2013 | Kapoor et al. | |
| 2017/0280399 A1* | 9/2017 | Chrisikos | H04W 52/38 |
| 2018/0279208 A1 | 9/2018 | Eskildsen et al. | |
| 2022/0149961 A1 | 5/2022 | Yao et al. | |

FOREIGN PATENT DOCUMENTS

| | | |
|---|---|---|
| WO | 2021126803 | 12/2020 |
| WO | 2021126803 A1 | 6/2021 |

OTHER PUBLICATIONS

EP20839479.1, Rule 71(3) Communication—Intention to Grant, Jul. 11, 2024.
EP20839479.1, Communication Pursuant to Article 94(3) EPC, Feb. 28, 2024.
EP20839479.1, Response to Art 94-3 Comm, Feb. 28, 2024.
EP20839479.1, Response to Rule 161 Communication, Jan. 26, 2023.
EP20839479.1, Communication Pursuant to Rules 161(1) and162 EPC, Jul. 26, 2027.
PCTUS2020065016, International Search Report.
PCTUS2020065016, Invitation to pay additional fees.
PCTUS2020065016, ISA Search Strategy.
PCTUS2020065016, ISA Written Opinion.

* cited by examiner

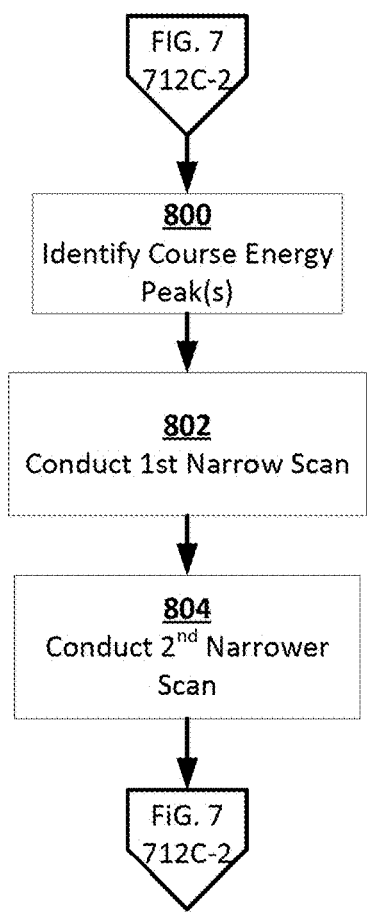
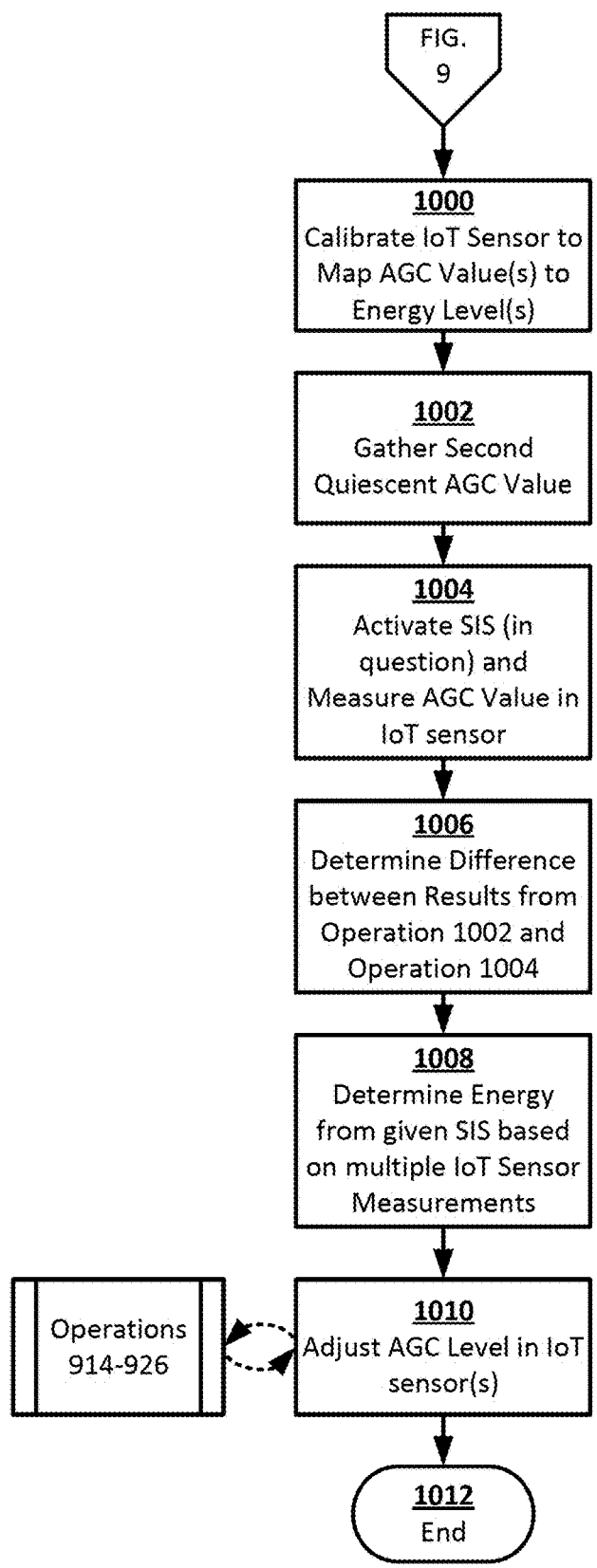
FIG. 8
FIG. 10

IDENTIFYING SIGNAL INTERFERENCE SOURCES

CROSS REFERENCE TO RELATED APPLICATIONS

This application is a Continuation application of U.S. patent application Ser. No. 17/455,329 (the "'329 App"), which was filed on 17 Nov. 2021, in the name of inventors Kevin Yao et al., entitled Identifying Signal Interference Sources, which is a Continuation application of U.S. patent application Ser. No. 16/718,324 (the "'324 App"), which was filed on 18 Dec. 2019, in the name of inventors Kevin Yao et al., and is entitled "Devices, System and Processes for Detecting and Remediating Interference Signals and Identifying Signal Interference Sources," priority is claimed to each of the '329 App and the '324 App and the entire contents of each of the '329 App and the '324 App are incorporated herein by reference.

TECHNICAL FIELD

The technology described herein generally relates to devices, systems, and processes for identifying a source of an interfering signal. The technology described herein also generally relates to devices, systems, and processes for remediating an interfering signal. The technology described herein also generally relates to devices, systems and processes identifying a source of an interfering signal to a wireline, wireless, and/or hybrid wireline and wireless communications system. The technology described herein also generally relates to devices, systems and processes identifying a location at which a signal is degraded, for example, by an undesired egress of electrical energy, in a wireline system. The technology described herein also generally relates to devices, systems and processes identifying a source of an interfering signal, wherein the interfering signal interferes with radio frequency (RF) signals used in conjunction with an Internet-of-Things (IoT) implementation and/or other implementations.

BACKGROUND

When deploying and/or using a wireline, wired or combined wireline and wired communications system (individually and collectively referred to herein as a "communications system"), one or more degradations of communications signals communicated using such system may arise. For example, in a wireline system, an egress of electrical energy provided in a communications signal may occur due to a short, a signal tapping, or otherwise. Similarly, and in a wireless communications signal, an egress node may arise from RF shielding, RF interference, or the like. Such RF shielding and the like commonly results in a temporary and/or permanent shunting or redirecting of received RF energy to another node, such as to a ground node, and/or a diminishing of an effective output power of an RF signal. Other forms of egress nodes may arise. As used herein, an "egress node" is a location at which a given communications signal is temporarily, permanently, or otherwise unintentionally or intentionally diminished, degraded, reduced in power, or otherwise undesirably effected along a communications link arising between one or more sending nodes and one or more receiving nodes and with respect to one or more communications signals.

Further, it is to be appreciated that a point of egress into a communications signal, on a given communications link, may also function as a point of ingress onto the communications link and, sometimes, into the communications signals communicated thereby. An egress node may function as an insertion node at which unintended signals and/or energy may be inserted into a given communications link and/or communications signal. Such unintended signals may be intentional, unintentional, nefarious, non-nefarious, random, constant, intermittent or otherwise. It is commonly appreciated and known that governmental regulations, privacy considerations, and other technical and business considerations often aim to prevent the insertion of unintended signals onto communications links and/or into communications signals.

Similarly, a communications signal may be subject to one or more interferences, a source of such interference being referred to herein as an "interfering node." Interference may arise naturally (for example, by lightning, solar storms, and otherwise), unintentionally (for example, by power lines and transformers, consumer electronic devices, microwaves, lighting fixtures, and otherwise), and intentionally (such as, by RF signal transmitters, such as digital and analog TV transmissions, Wi-Fi devices, consumer electronic devices configured to emit RF signals, and otherwise). Interference may arise for any or no purpose. A person having ordinary skill in the art is aware and familiar with the too numerous to list and characteristics of interfering nodes and potential types and sources of RF signal interference.

An egress node and/or an interfering node may give rise to, provide, contribute to, be a source or a sink of, or otherwise give rise to an egress, insertion, or interfering of RF energy relative to a desired given communications signal. As used herein, the egress, insertion, and/or interference of RF energy into and/or from a given communications signal is individually, interchangeably, and collectively referred to herein as the providing of an "interfering signal" and resulting in a "signal interference." Such signal interference may result in a given communications signal being unacceptable for its intended use, such as having insufficient power, having a decreased signal to noise ratio, containing unintended signals, or otherwise.

Signal interference may render some or all of a given communications signal inoperable and/or incapable of fulfilling a purpose thereof. Signal interference may arise continually, temporarily, intermittently, randomly, or otherwise. Signal interference may arise, in whole or in part, from a single source or from multiple sources. Herein, a source of an interfering signal may be an egress node and/or an interfering node and is referred to commonly as a "signal interference source ("SIS"). An interfering signal may be emitted, inserted or egressed over any frequency range and/or frequency ranges, at any power level, at any time, and any other conditions. Signal interference may arise non-nefariously, such as from a signal that is emitted by a licensed entity, or an entity otherwise permitted to emit radio frequency signals. Signal interference may arise accidentally, such as an RF signal that arises due to a malfunction, mis-tuning, or other condition present, at a given time, with respect to a given signal source. Signal interference may arise intentionally, such as an RF signal that is emitted in order to degrade or interfere with another RF signal.

Accordingly, it is to be appreciated that an identification of an interfering signal and a SIS is often desired for any of the above reasons and other reasons. Yet, device, systems and processes for identifying an interfering signal and/or an SIS often involve dispatching of a technician. Such technician may commonly seek to identify a location of an interference by use of signal meters and other known signal detection and measurement devices. Yet, such common approaches are often ineffective for various reasons. For example, the technician may not be present when an interfering signal occurs, identification of an interfering signal source may be difficult, and otherwise.

Accordingly, devices, systems and processes which address the above and other deficiencies are needed.

SUMMARY

The various embodiments of the present disclosure describe devices, systems, and processes for detecting an interfering signal and identifying a signal interference source. One or more of the various embodiments also relate to processes for remediating, in whole or in part, an interfering signal. One or more of the various embodiments described herein also generally relate to devices, systems and processes identifying a source of an interfering signal, wherein the interfering signal interferes with RF signals used in conjunction with an IoT implementation.

In accordance with at least one embodiment of the present disclosure, a process, for identifying an detecting an interfering signal may include conducting a scan of one or more frequency bands to obtain at least one scan result. The process may also include determining, from the at least one scan result, if a response condition has been detected. If a response condition has been detected; the process may include identifying a first frequency band corresponding to the detected response condition, determining whether a response condition action is to be performed. If no response condition action is to be performed; the process may include continue scanning of the one or more frequency bands. If a response condition is to be performed; the process may include identifying each of two or more sensors as an available sensor, selecting at least one of the available sensors as a selected first sensor, developing a scan plan, instructing the selected first sensor to initiate the scan plan, receiving first scan data from the first sensor, and analyzing the first scan data to identify a second frequency band. The second frequency band may be indicative of an interfering signal, generated by a signal interference source, and arising within the first frequency band. The process may also include, as based on at least the first scan data, estimating a location for the signal interference source (SIS).

For at least one embodiment, the available sensor may be an IoT sensor, and the process may be performed by using at least one of a frequency manager, a frequency controller and an IoT controller.

For at least one embodiment, the first frequency band may include at least one frequency utilized by the IoT sensor to communicate with the IoT controller.

For at least one embodiment, the process may include identifying two or more sensors by at least one of accessing a sensor database to identify each of the two or more sensors and initiating a query and response process to identify each of the two or more sensors.

For at least one embodiment, the two or more sensors may be located within a given geographic area.

For at least one embodiment, the first sensor may initiate the scan plan by scanning the first frequency band during at least one first time period.

For at least one embodiment, the scan plan may include scanning of at least one frequency band adjacent to the first frequency band.

For at least one embodiment, the scan plan may preclude scanning of the first frequency band when the first sensor is scheduled to perform another activity For at least one embodiment, the first scan data may be received in a scan result report generated by the first sensor and based upon multiple scans of the first frequency band by the first sensor.

For at least one embodiment, the interfering signal arises intermittently within the first frequency band.

For at least one embodiment, the scan plan may include instructions for the first sensor to redirect at least one communications signal. The at least one communications signal, prior to being redirected, may be communicated over a third frequency band. The third frequency band may share, at least in part, spectrum with at least one of the first frequency band and the second frequency band. The at least one communications signal, after being redirected, may be communicated over a fourth frequency band. The fourth frequency band may be distinct from each of the first frequency band and the second frequency band.

For at least one embodiment, the scan plan may include instructing the first sensor to suspend use of the third frequency band.

For at least one embodiment, the scan plan may include at least one non-transient computer instruction which instructs the first sensor to execute at least one of a standard scan plan, an iterative scan plan, and an antenna command.

For at least one embodiment, an iterative scan plan may instruct the first sensor to perform at least one non-transient computer instruction comprising operations for: scanning the first frequency band, using a first scan width, across the first frequency band, to detect a coarse energy peak arising within the first frequency band; and when the coarse energy peak is detected, conducting a first narrow scan of a first frequency band about the detected coarse energy peak to identify a first narrow coarse energy peak.

For at least one embodiment, the iterative scan plan may also include computer instructions for conducting a second narrow scan about the first narrow coarse energy peak to identify a second narrow coarse energy peak.

For at least one embodiment, an iterative scan plan may include use of a first narrow scan configured to use a first narrow scan width that is one-fifth of the first scan width and is centered on the detected coarse energy peak. A second narrow scan using a second scan width that is one-fifth of the first narrow scan width and is centered on the first narrow coarse energy peak may also be used.

In accordance with at least one embodiment of the present disclosure, a device configured to detect an interfering signal may include a processor and a communications module. The processor may be configured to execute at least one non-transient computer instruction providing a scan plan. The communications module may include at least one transponder and an automatic gain controller (AGC). The scan plan may first configure the transponder to first scan a first frequency band and the AGC to first monitor a first received signal strength across the first frequency band for a coarse energy peak indicative of an interfering signal being present in the first frequency band.

For at least one embodiment, the scan plan may second configure the transponder to second scan a narrower frequency band and the AGC to second monitor a second received signal strength across the narrower frequency band for a first narrow coarse energy peak indicative of the interfering signal being present in each of the first frequency band and the narrower frequency band.

For at least one embodiment, the processor and the communications module may be provided in an IoT sensor; wherein the scan plan is received by the IoT sensor from an IoT controller.

In accordance with at least one embodiment of the present disclosure, a process, for remediating a detected interfering signal, may include determining a quiescent noise level for a sensor. The sensor may include an automatic gain controller (AGC) configured to measure signal strength of one or more received radio frequency signals. The process may also include determining, using the AGC and while a first node communicatively coupled to the sensor is not actively transmitting, a signal strength for an interfering signal. the process may also include determining, using the AGC and while the first node is actively transmitting, a signal strength for a received combined signal. The received combined signal may include first energy received in the interfering signal and second energy received from the first node.

The process may also include determining whether the AGC is at a saturation level. If the AGC is at the saturation level, the process may include determining a ratio of the received combined signal attributable to received second energy. If the ratio exceeds a first threshold, the process may include decreasing the second energy received from the first node by at least one of: decreasing an output power of the first node; shielding the sensor from the interfering signal; and moving the sensor relative to a location for a source of the interfering signal.

If the AGC is not at the saturation level, the process may also include determining, using the AGC and while the first node is actively transmitting, if the AGC is at a maximum value. If the AGC is at the maximum value, the process may include reducing at least one gain setting for the AGC. If the AGC is not at the maximum value, the process may include determining, while the first node is actively transmitting and the interfering signal is not present, a signal strength range for the second energy received from the first node.

For at least one embodiment, the process may include using an IoT sensor as the sensor and at least one of a frequency manager, a frequency controller and an IoT controller.

BRIEF DESCRIPTION OF THE DRAWINGS

The features, aspects, advantages, functions, modules, and components of the devices, systems and processes provided by the various embodiments of the present disclosure are further disclosed herein regarding at least one of the following descriptions and accompanying drawing figures. In the appended figures, similar components or elements of the same type may have the same reference number and may include an additional alphabetic designator, such as 108*a*-108*n*, and the like, wherein the alphabetic designator indicates that the components bearing the same reference number, e.g., 108, share common properties and/or characteristics. Further, various views of a component may be distinguished by a first reference label followed by a dash and a second reference label, wherein the second reference label is used for purposes of this description to designate a view of the component. When only the first reference label is used in the specification, the description is applicable to any of the similar components and/or views having the same first reference number irrespective of any additional alphabetic designators or second reference labels, if any.

FIG. 8 is a flow chart depicting an iterative process for use in identifying an interfering signal and in accordance with at least one embodiment of the present disclosure.

FIG. 10 is a flow chart depicting a second remediation process for an interfering signal and in accordance with at least one embodiment of the present disclosure.

DETAILED DESCRIPTION

Figure 1:
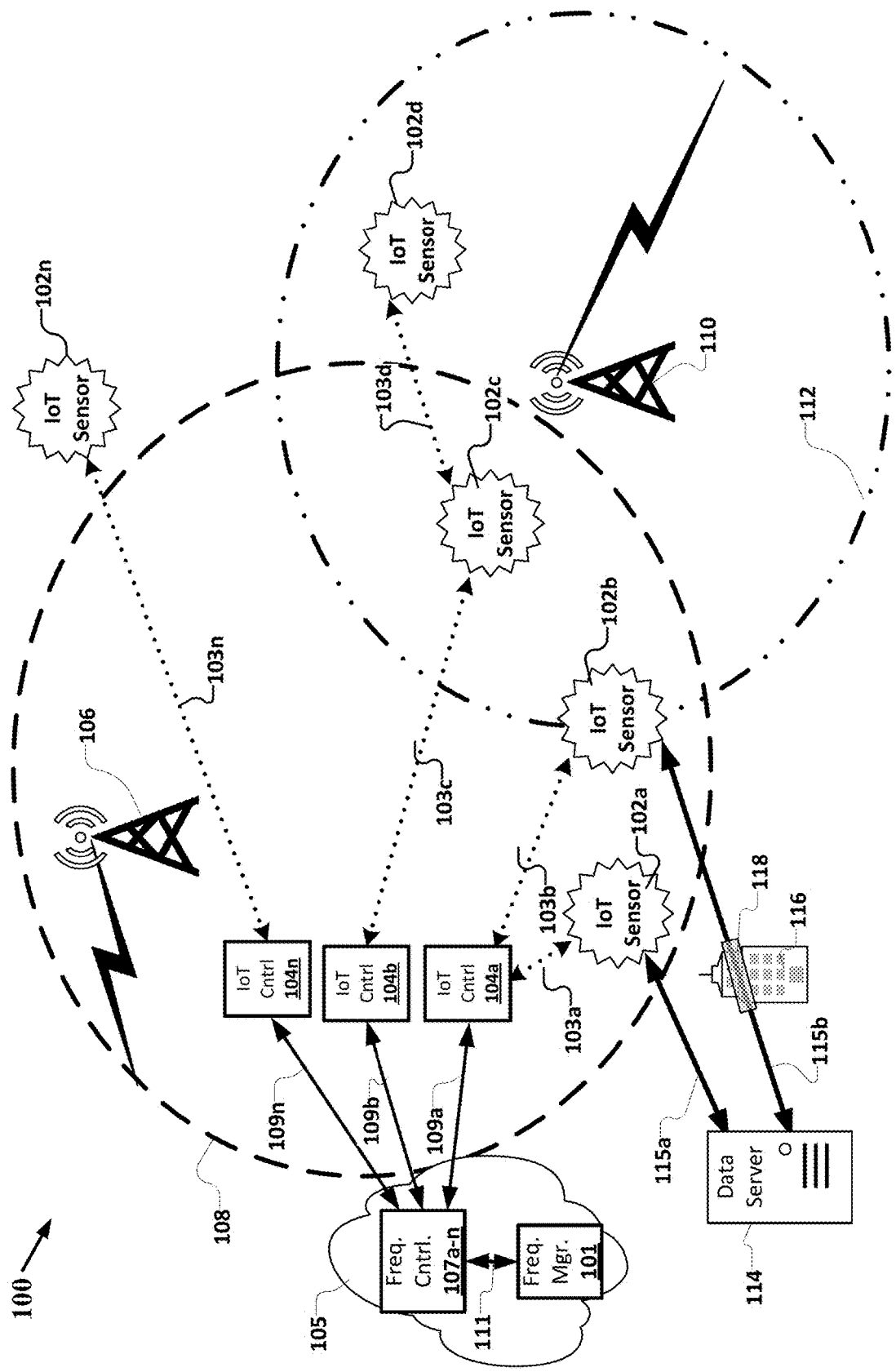
FIG. 1 is a schematic representation of a system for use in identifying an interfering signal and/or a signal interference source and in accordance with at least one embodiment of the present disclosure.

The various embodiments described herein are directed to devices, systems, and processes for detecting an interfering signal, identifying a source of such interfering signal and remediating the interfering signal. One or more of the various embodiments described herein also generally relate to devices, systems and processes identifying a location at which a communications signal is degraded, for example, by an undesired egress of electrical energy, in a wireline system at an egress node. One or more of the various embodiments described herein also generally relate to devices, systems and processes identifying a source of an interfering signal, wherein the interfering signal interferes with RF signals used in conjunction with IoT implementations.

It is to be appreciated that a signal interference source may be active and/or inactive continually, randomly, predictably, at various times, under various conditions, intermittently, or otherwise. Likewise, a signal interference source may emit or degrade signals at constant, intermittent, varying and/or other signal strengths, frequencies, bands, bandwidths, and otherwise. Detection and identification of such interfering signals may be addressed by at least one embodiment of the present disclosure by using one or more IoT sensors to search, detect and/or sense an interfering signal and properties thereof.

For at least one embodiment, one or more IoT sensors are configured for use in detecting interfering signal(s) and identifying a SIS. It is to be appreciated that for at least one embodiment of the present disclosure, a given IoT sensor may also, and/or alternatively, be used for detecting other, non-interfering signals. For example, an IoT sensor primarily configured as a water meter gauge may be used, for at least one embodiment, to monitor a power level of a cellular service, such as a 5G service and may be configured to detect, identify and report, to a frequency controller, measured characteristics for such 5G service on an as desired, emergency, periodic, or other basis.

For at least one embodiment, one or more IoT sensors may be communicatively coupled to one or more "IoT controllers." As described herein, an IoT controller may be configured to control one or more IoT sensors using commonly available and/or later arising IoT sensor control technologies. In accordance with the various embodiments of the present disclosure, an IoT controller may be configured to facilitate use of one or more IoT sensors for interfering signal detection and SIS identification.

For at least one embodiment, an IoT controller may be communicatively coupled to a "frequency controller." As described herein, a frequency controller may be configured to develop and initiate one or more scan plans (as described below). The frequency controller may develop and initiate such scan plan(s) based upon inputs received from one or more frequency managers and/or one or more IoT controllers. The frequency controller, as described herein, communicatively couples one or more IoT controllers with a frequency manager.

For at least one embodiment, a frequency controller may be communicatively coupled to a "frequency manager." As described herein, a frequency manager, may be configured to maintain and manage a long-term state for a communications system. For at least one embodiment, a frequency manager may be configured to provide and perform complex, and/or data intensive computational activities. For at least one embodiment, a frequency manager may be configured to develop one or more frequency monitoring campaigns (as further described below). The frequency manager, as described herein, is the entity, process, server or system responsible for managing use of one or more RF frequencies.

For at least one embodiment, IoT controllers may be provided "in the field" so as to be within a desired communications range of one or more IoT sensors with respect to which the IoT controller provides one or more control signals. Frequency controllers and frequency managers may be hosted on remote servers, such as those which are "Cloud" based. As used herein, "Cloud" based, cloud computing, and the like refers to on-demand use of computing, data storage and/or other technology resources without requiring an active management of such resources. A Cloud may be private (limited to certain users and/or uses), public (available for many users and/or uses), hybrid, or otherwise. It is to be appreciated that the frequency controller and/or the frequency manager may use Cloud resources to provide economies of scale, as needed for any given data storage, computational, artificial intelligence, machine learning, or other technological tasks.

For at least one embodiment, the various elements of a given system including the IoT sensor(s), IoT controller(s), frequency controller(s) and frequency manager may be communicatively coupled by use of Cloud devices, such as those provided using the Internet or otherwise, other communications technologies, or otherwise.

For at least one embodiment, a frequency controller may include a frequency manager or may be used separately with a frequency manager. Accordingly, reference herein to capabilities, characteristics, operations or otherwise provided or performed by a frequency controller or a frequency manager may also be applied, in one or more embodiments, to one or more of a frequency controller, a frequency manager and/or a combination of a frequency manager and a frequency controller.

As shown in FIG. 1, a schematic representation of a system 100 for use in identifying an interfering signal and/or a signal interference source (SIS), and in accordance with at least one embodiment of the present disclosure, includes one or more IoT sensors 102*a-n* that are communicatively coupled by one or more IoT links 103*a-n*, to at least one IoT controller 104. While only a single IoT link 103 is depicted in FIG. 1 between a given IoT sensor 102 and a given IoT controller 104, it is to be appreciated that additional, redundant, back-up and other communication links may be used for a given implementation of an embodiment of the present disclosure. It is to be appreciated that multiple IoT controllers 104 may be used in a given embodiment and that multiple IoT links 103 may be used to communicatively couple one or more IoT sensors 102 with one or more IoT controllers 104. The IoT controllers 104 may be communicatively coupled to a frequency controller 107, by use of one or more control links 109. The frequency controller(s) 107 may be communicatively coupled to a frequency manager 101 by one or more management links 111. One or more of the capabilities provided by the frequency controllers 107 and frequency manager 101 may be facilitated by Cloud 105 based servers, stand-alone servers, or otherwise.

The IoT sensors 102 may be communicatively coupled to one or more data servers 114 by one or more data links 115*a-n*. The data servers 115*a-n* may also be Cloud based or otherwise provided. For at least one embodiment, the data servers 115*a-n* may be provided in conjunction with one or more of the frequency manager 101 and/or a frequency controller 107.

For at least one embodiment, an IoT sensor 102 may be utilized for any desired primary function. Non-limiting examples of such primary functions include wind, moisture, vibration, atmospheric pressure, ultra-violet light exposure, sunlight intensity, and otherwise. The IoT links 103*a-n*, control links 109*a-n*, management links 111, and data links 115*a-n* may utilize any desired presently available and/or later arising communications frequencies, topologies, devices, systems, and technologies to facilitate communication of data between two or more of the IoT sensors 102, IoT controller(s) 104, frequency controller(s) 107, frequency manager(s) (101), and data server(s) 114. As further discussed below, an IoT sensor 102 may be utilized to perform its primary function and one or more signal interference detection, identification and/or other functions at the same time as its primary function is being performed, when the primary function is not being performed, or otherwise.

The one or more IoT sensors 102a-n may reside within or outside of a range of one or more interfering nodes, such as a first signal interference source 106 emitting a first interfering signal 108, or a second signal interference source 110 emitting a second interfering signal 112. For purposes of explanation herein only, the first interfering signal 108 and the second interfering signal 112 are depicted in FIG. 1 as being emitted in 360 degrees patterns. An interfering signal may be emitted in-band or out-of-band with a desired measured signal. When in-band, the interfering signal may directly interfere with one or more IoT links 103 and/or data links 115. When out-of-band, the interfering signal may have a form of energy in a RF band that is adjacent to a measured signal, yet, within one or more bands measurable by the AGC. It is to be appreciated that an AGC may be driven into saturation by energy received in one or more adjacent RF bands. Accordingly, the various embodiments of the present disclosure are intended to cover both in-band, out-of-band and other interfering signals. It is to be appreciated that other signal patterns may be utilized by a signal interference source and the frequencies, bandwidth, properties and other characteristics of an interfering signal may vary, as desired for any given implementation of an embodiment of the present disclosure. The first interfering signal 108 and the second interfering signal 110 may influence or interfere with operations of one or more of the IoT sensors 102a-n, one or more of the IoT links 103a-n, one or more control links 109a-n, one or more data links 115a-n, and/or otherwise interfere with one or more of the frequency bands managed by a frequency manager 101.

As further shown in FIG. 1, a building 116, tree (not shown), geographic feature, or other structure may function as an egress node 118. Such egress node 118 may physically and/or functional impede, degrade, or otherwise interfere with one or more communication links between and/or operations of one or more IoT sensor(s) 102, IoT controller(s) 104, frequency controller(s) 107, frequency manager(s) 101 and/or data server(s) 114. As shown for purposes of illustration only and in FIG. 1, egress node 118 degrades a second data link 115b between a second IoT sensor 102b and a data server 116.

Figure 2A:
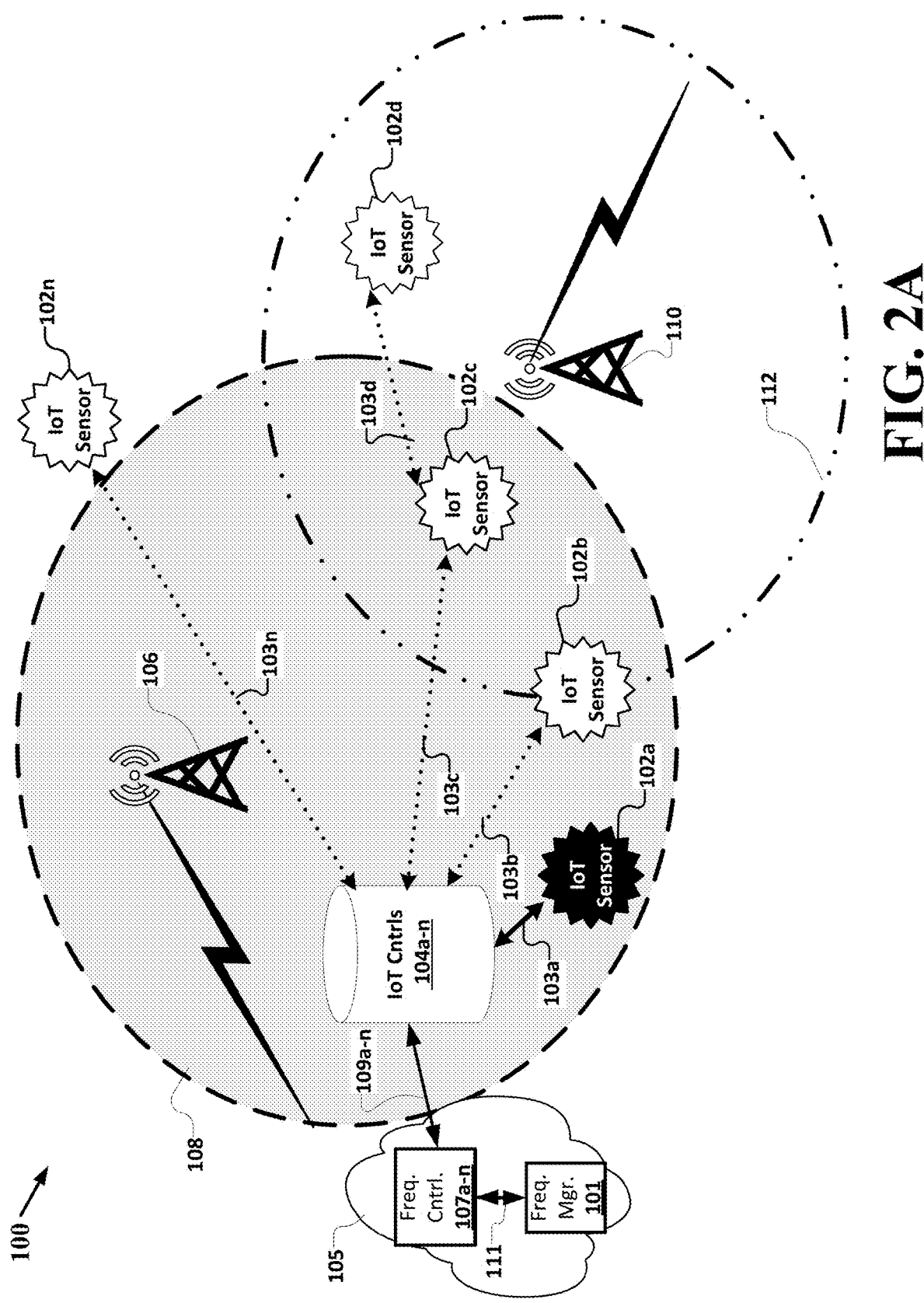
FIG. 2A is a schematic representation of a system, wherein a first signal interference source is active and providing a first interfering signal and a first IoT sensor is utilized for identifying at least one of the first signal interference source and the first interfering signal, in accordance with at least one embodiment of the present disclosure.

As shown in FIG. 2A, a first signal interference source 106 may be active and emitting the first interfering signal 108. The frequency manager 101, frequency controller 107 and IoT controller 104 may be configured to utilize the first IoT sensor 102a, continually and/or at one or more first sampling times, to detect the first interfering signal 108. For at least one embodiment, the frequency manager 101, frequency controller 107 and/or IoT controller 104, as desired for any given implementation, may be configured to "wake-up" an IoT sensor 102 at any time. For example, on an immediate, real-time, scheduled, unscheduled, or any other basis. Further and for at least one embodiment, one or more of the frequency manager 101, frequency controller 107 and/or IoT controller 104 may be configured to instruct an IoT sensor 102 to halt performance of a currently active primary function and to commence with performing one or more signal interference functions. Resumption of the primary function may occur at any desired time, as specified by one or more of the frequency manager 101, frequency controller 107 and/or IoT controller 104 communicatively coupled to the given IoT sensor 102.

As shown in FIGS. 2A-2C, 3, 4 and 5 and for purposes of illustrative simplicity only, a single IoT controller 104, a single frequency controller 107 and a single frequency manager 101 are depicted. As discussed above, the various embodiments are not so limited. It is to be appreciated that any number of such elements may be used in a given embodiment of the present disclosure.

When an interfering signal is detected, for at least one embodiment an IoT sensor 102, such as the first IoT sensor 102a, may be configured to measure a signal strength and/or other signal properties and/or characteristics of the first interfering signal 108. As shown by the solid line depicted for the first IoT link 103a, a continually active, bi-directional or unidirectional communications link may be established between the IoT controller 104 and the first IoT sensor 102a to facilitate reporting of a first scan data provided by the IoT sensor 102a. Likewise, for at least one embodiment, a continually active, bi-directional communications link may be established between an IoT controller 104 and a frequency controller 107. For other embodiments, one or more of the communications link may be active for any given period of time, configured to simplex, duplex or other communications, or otherwise configured, as so desired for a given embodiment.

For at least one embodiment, an IoT sensor 102 may be configured to report first scan data, and any other data, using one or more communications signals, one or more repeated communications signals, one or more different communications signals, or otherwise. An IoT sensor 102 may be configured to repeatedly, intermittently, or other transmit a given data set until an acknowledgement message or the like is received from each of one or more intended recipients of a given communications signals such as, but not limited to, an IoT controller 104.

For at least one embodiment, a frequency manager 101, frequency controller 107 and IoT controller 104 may be configured to utilize the first IoT sensor 102a to use intelligent-selective scanning. For intelligent-elective scanning, one or more predetermined and/or pre-set frequencies may be designated for scanning Such frequencies may be "offensive frequencies"—frequencies designated as known interfering frequencies based upon historical data collected from one or more previous campaigns and results arising from such previous campaigns. It is to be appreciated that such use of intelligent-selective scanning may arise, for at least one embodiment, to determine whether previous remedies are effective and/or whether a previously detected interferer is complying with one or more restrictions placed upon them by contract, court order, technical considerations, or otherwise.

Figure 2B:
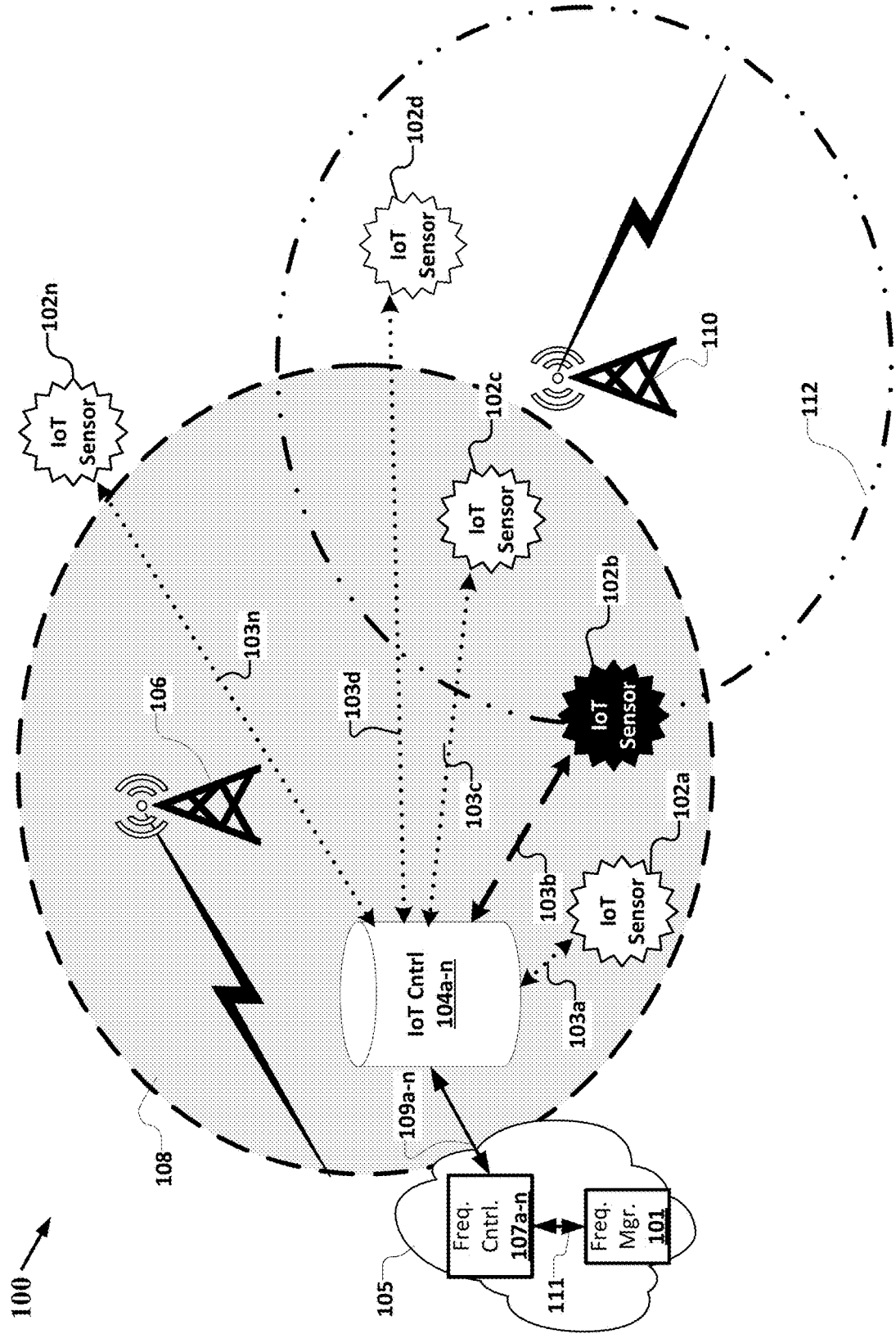
FIG. 2B is a schematic representation of a system, wherein the first signal interference source of FIG. 2A is active and providing the first interfering signal and a second IoT sensor is utilized for identifying at least one of the first signal interference source and the first interfering signal, in accordance with at least one embodiment of the present disclosure.

As shown in FIG. 2B, the frequency manager 101 may specify a campaign and a frequency controller 107 may accordingly therewith initiate a scan plan that instructs one or more IoT controllers 104 to configure and utilize one or more second IoT sensors, such as second IoT sensor 102b, as desired, to detect the first interfering signal 108. The first interfering signal 108 may be continually or otherwise present. The second IoT sensor 102b may be used to detect and/or determine a signal strength and/or other signal properties and/or characteristics of the first interfering signal 108.

The frequency manager/frequency controller/IoT controller 101/107/104 may be configured to utilize the second IoT sensor 102b at the same or different times as it uses the first IoT sensor 102a or any other IoT sensor 102. As shown by the dashed line depicted for the second IoT link 103b, a periodically active, bi-directional or unidirectional communications link may be respectively established between two or more of the second IoT sensor 102b, IoT controller 104, frequency controller 107 and frequency manager 101 to facilitate reporting of a second scan data generated by the second IoT sensor 102b. The second scan data may be responsive to a detected first interfering signal 108 and may identify one or more characteristics of the first interfering signal 108.

Figure 2C:
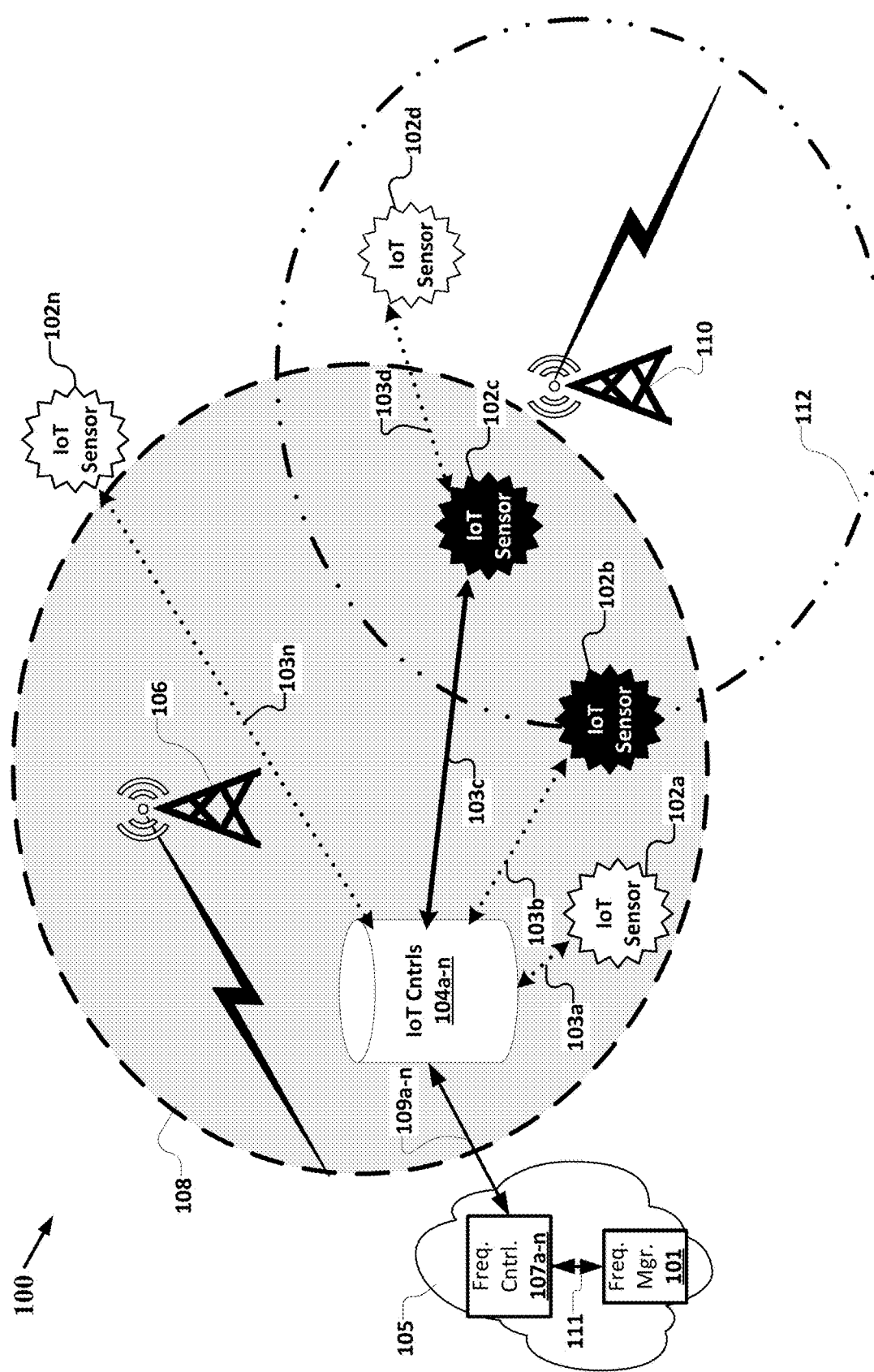
FIG. 2C is a schematic representation of a system, wherein the first signal interference source of FIGS. 2A and 2B is active and providing the first interfering signal and a third IoT sensor is utilized for identifying at least one of the first signal interference source and the first interfering signal, in accordance with at least one embodiment of the present disclosure.

As shown in FIG. 2C, the frequency manager/frequency controller/IoT controller 101/107/104 may be configured to utilize each of the second IoT sensor 102b and a third IoT sensor 102c. The IoT sensors 102b/c may be used at one or more second or third sampling times and in order to detect the first interfering signal 108. Respective second scan data and third scan data generated by the IoT sensors 102b/c and pertaining to the first interfering signal 108 may include signal strength, frequency, periodicity (if any), and/or other signal properties and/or characteristics thereof. The second scan data and third scan data may include the same or different data.

The frequency manager/frequency controller/IoT controller 101/107/104 may be configured to utilize the second IoT sensor 102b and/or the third IoT sensor 102c at the same or different times as it uses the first IoT sensor 102a or any other IoT sensor 102.

As shown by the dashed line depicted for the second IoT link 103b, a periodically active, bi-directional or unidirectional communications link may be respectively established between two or more of the second IoT sensor 102b, IoT controller(s) 104, frequency controller(s) 107 and frequency manager(s) 101 to facilitate reporting of the second data arising during use of the second IoT sensor 102b for interfering signal detection, identification and other purposes.

As shown by the solid line depicted for the third IoT link 103c, a continually active, bi-directional or unidirectional communications link may be respectively established between two or more of the third IoT sensor 102c, IoT controller(s) 104, frequency controller(s) 107 and frequency manager(s) 101 to facilitate reporting of a third scan data arising during use of the third IoT sensor 102c for interfering signal detection, identification and other purposes.

It is to be appreciated that based on one or more instances and/or collections of scan data, such as the first scan data, second scan data, and third scan data, one or more combinations of IoT controller(s) 104, frequency controller(s) 107 and/or frequency manager(s) 101 may use respectively detected signal strengths and/or other reported characteristics of the first interfering signal 108 and known triangulation calculations to determine a location of the first signal interference source 106, the nature thereof and other information. Such interfering signal data may also and/or alternatively be used for different purposes, such as determining periodicity of emissions, frequencies used, bandwidth used, transmitting power and other characteristics of the first interfering signal 108 and/or the first signal interference source 106. Such determinations may be used by one or more IoT controllers 104, frequency controllers 107 and/or frequency managers 101 for any purpose, such as to specify when a given IoT sensor 102 is active, inactive, transmitting, powered to receive signals or otherwise.

Figure 3:
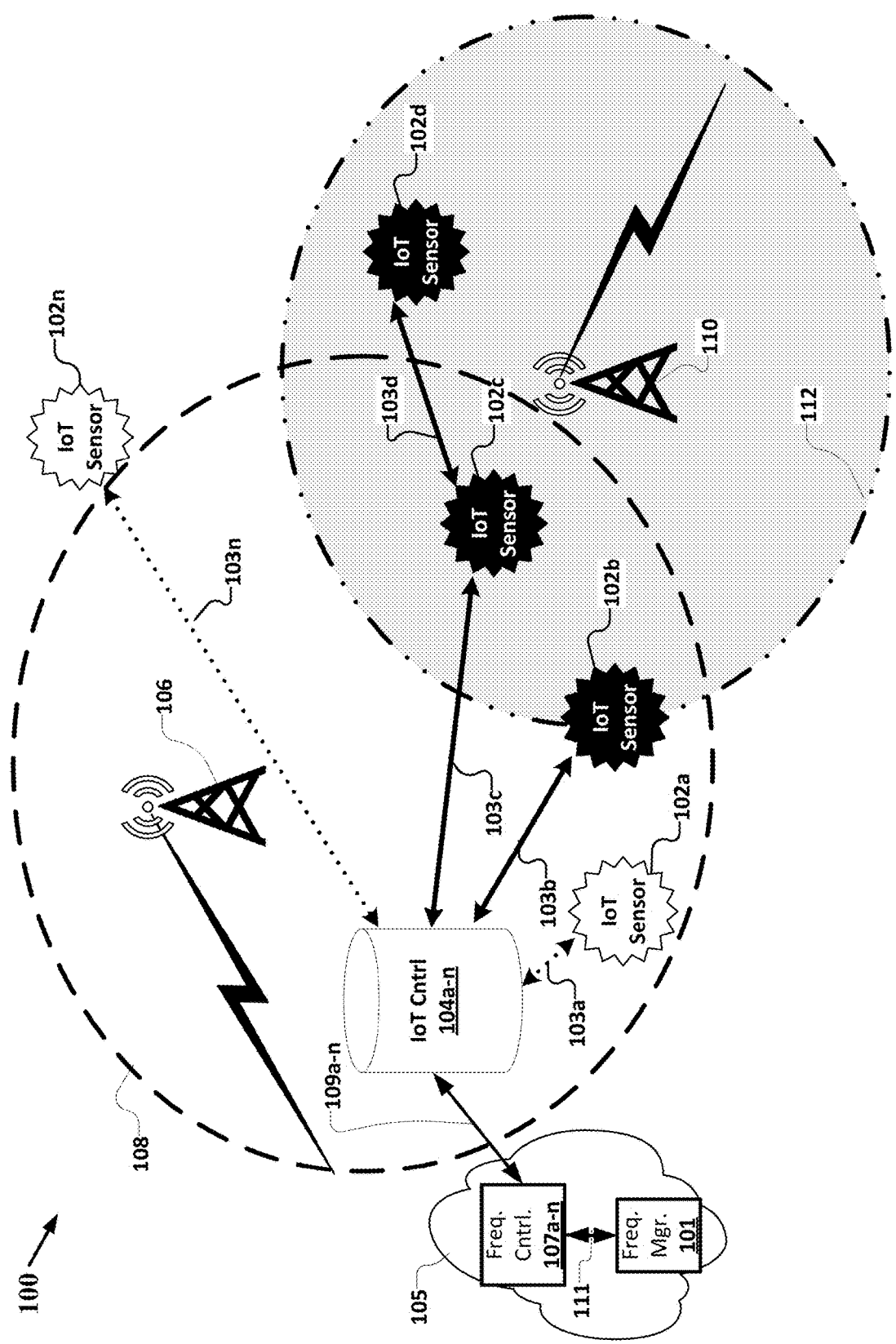
FIG. 3 is a schematic representation of a system, wherein a second signal interference source is active and providing a second interfering signal and at least one of the first IoT sensor, the second IoT sensor, and the third IoT sensor are utilized for identifying at least one of the second signal interference source and the second interfering signal, in accordance with at least one embodiment of the present disclosure.

As shown in FIG. 3, the frequency managers/frequency controllers/IoT controllers 101/107/104 may be configured to utilize one or more of the second IoT sensor 102b, the third IoT sensor 102c, and a fourth IoT sensor 102d. The IoT sensors 102b/c/d may be used at one or more second/third or fourth sampling times and in order to detect presence, signal strength and/or other properties and characteristics of a second interfering signal 108. The respective sampling times may arise concurrently or non-concurrently, overlap, or otherwise. The respective sampling times may be preset for each IoT sensor 102 or variably set, for example as specified by the frequency manager 101 (per a campaign plan), as instructed by a frequency controller 107 (per a scan plan) and as controlled by an IoT controller 104, or otherwise. It is to be appreciated that the detected presence, signal strength and other properties and characteristics of any reported scan data may vary by IoT sensor type, IoT sensor location, IoT sensor capabilities, and other factors.

The frequency managers/frequency controllers/IoT controller(s) 101/107/104 may be configured to utilize the second IoT sensor 102b, the third IoT sensor 102c, and/or the fourth IoT sensor 102d for interfering signal detection and the like at the same or different times that they, collectively, use any other IoT sensor, such as the first IoT sensor 102a. As shown by the solid lines depicted for each of the second IoT link 103b, the third IoT link 103c and the fourth IoT link 103d, each of the IoT links 103 may be continually active, bi-directional or unidirectional communications link.

For at least one embodiment, one or more IoT links 103 may be established between the IoT controller(s) 104 and the respective IoT sensors directly, as shown by the second IoT link 103b and the third IoT link 103c, or indirectly, as shown by the fourth IoT link 103d which communicatively couples the fourth IoT sensor 102d to the frequency controller 104 via the third IoT sensor 103c and the third IoT link 103c. Any desired configuration of IoT links 103 may be used. Non-limiting examples of such configurations include peer-to-peer networks, mesh networks, and otherwise. The fourth IoT link 103d may be used to facilitate reporting of the fourth scan data arising during use of the fourth IoT sensor 102d for interfering signal detection, identification and other purposes.

Figure 4:
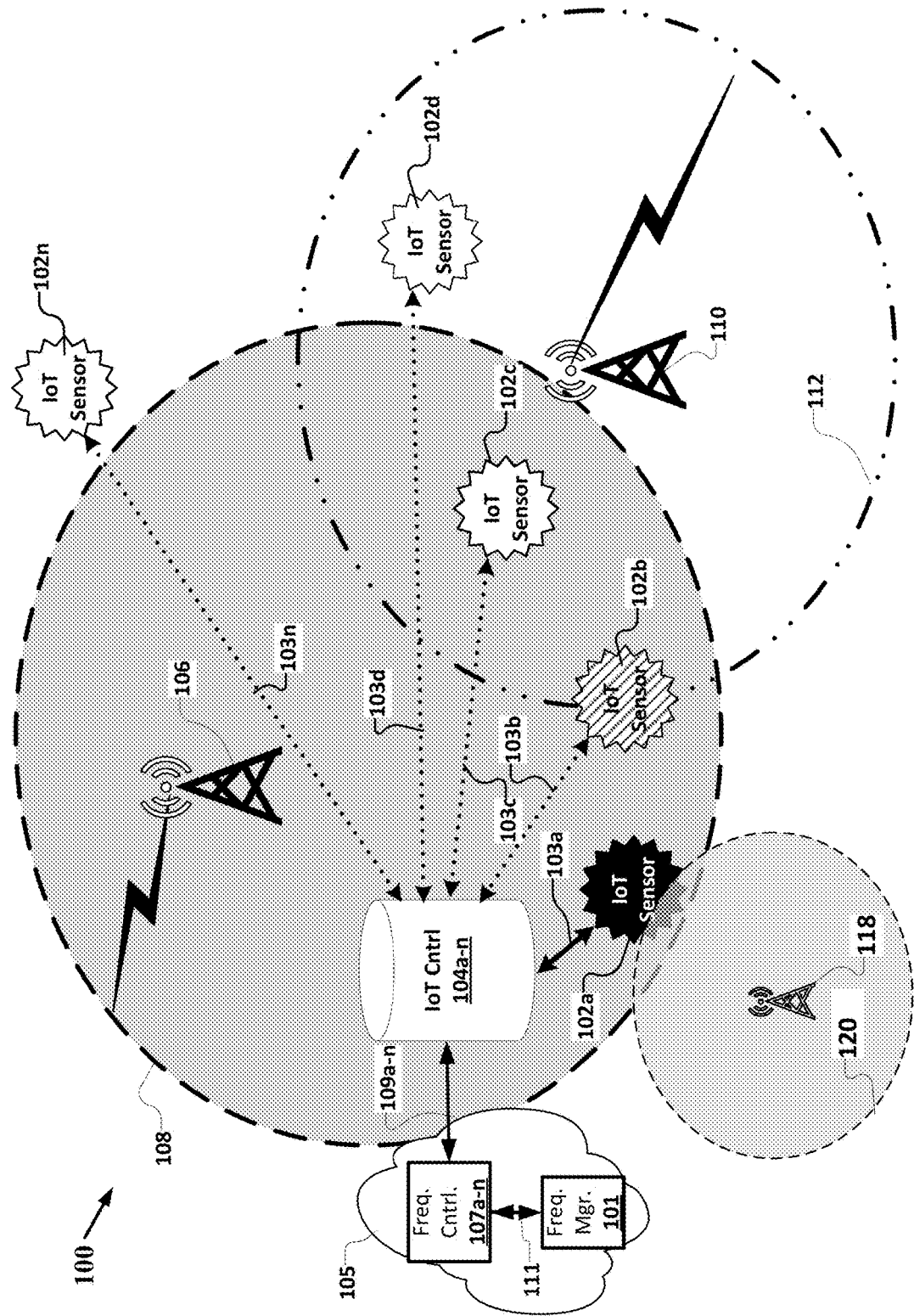
FIG. 4 is a schematic representation of a system wherein a third, intermittent signal interference source is active and providing a third interfering signal and the first IoT sensor is utilized for identifying at least one of the third signal interference source and the third interfering signal, in accordance with at least one embodiment of the present disclosure.

As shown in FIG. 4, the frequency manager(s)/frequency controller(s)/IoT controller(s) 101/107/104 may be configured to utilize one or more IoT sensors 102 to detect an intermittently occurring interfering signal, such as a third interfering signal 120 that is emitted by a third signal interference source 118. The frequency managers/frequency controllers/IoT controller(s) 101/107/104 may be further configured to accordingly develop a campaign, scan plan, and activate the second IoT sensor 102b to facilitate further detection and/or monitoring of the first interfering signal 108—such first interfering signal 108 may be emitted at the same time as the intermittent third interfering signal 120. Activation of the second IoT sensor 102b is illustrated in FIG. 4 by the use of a diagonal fill pattern. Activation of the first IoT sensor 102a for detection of the third interfering signal 120 is illustrated in FIG. 4 by use of solid fill. It is to be appreciated that the various elements of system 100 may be configured to operate such that the detected presence, signal strength and other properties or characteristics of two or more interfering signals may be determined adaptively, dynamically, or otherwise.

Figure 5:
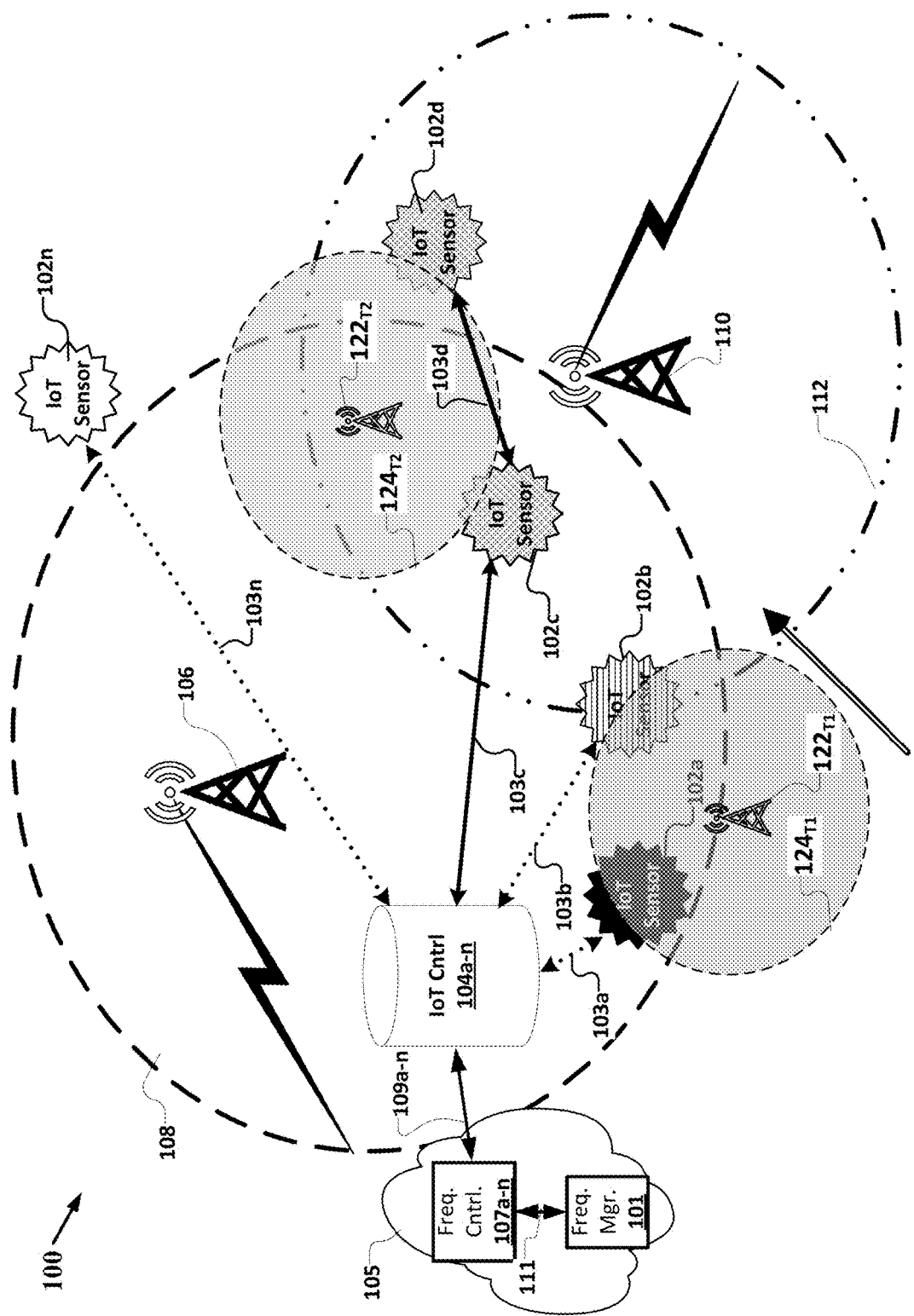
FIG. 5 is a schematic representation of a system, wherein a fourth signal interference source is non-stationary, active and providing a fourth interfering signal, the first IoT sensor and second IoT sensor are utilized for identifying the fourth interfering signal at a first time, and the third IoT sensor and the fourth IoT sensor are utilized in identifying the fourth interfering signal at a second time, in accordance with at least one embodiment of the present disclosure.

In FIG. 5, a fourth signal interference source 122 is depicted as being a non-stationary, active source that provides a fourth interfering signal 124. A current position of the fourth signal interference source 122 and the fourth interfering signal 124 may vary over time, such as from a first time T1 to a second time T2. The characteristics and properties of the fourth interfering signal 124 may also vary over time, such as having different transmission powers, frequencies, or otherwise. These detected properties of the fourth interfering signal 124 may vary over time and based on a given IoT sensor 102 utilized. For example, at time T1, detected properties of the fourth interfering signal 124 may be different for the first IoT sensor 102a versus those detected and determined by the second IoT sensor 102b. Further, as the fourth signal interference source 122 travels, Doppler and other signal processing techniques and technologies may be used. For example, one or more of the second IoT sensor 102b, an IoT controller 104, a frequency controller 107 and/or a frequency manager 101 may use Doppler techniques to determine a direction of travel (towards or away from the sensor) of the fourth signal interference source 122. The use of advanced signal processing techniques by a given system 100 component is illustrated by use of the horizontal fill lines for the second IoT sensor 102b versus the sold fill shading used for the first IoT sensor 102a, where the first IoT sensor 102a is not using such advanced signal processing techniques. It is to be appreciated that any form of advanced signal processing techniques may be performed, as desired, by an IoT sensor 102, IoT controller 104, frequency controller 107, and/or frequency manager 101 or otherwise. For at least one embodiment, a given computational task is performed at the system 100 device most capable of performing such computational tasks efficiently. It is to be appreciated that for certain simple computational tasks, an IoT sensor 102 may be suitably configured to so perform. For more advanced computational tasks, one or more of an IoT controller 104 and/or a frequency controller 107 may be configured to perform such tasks. Likewise, for complex computational tasks, such as those involving machine learning, artificial intelligence computations, voluminous data storage and retrieval, or otherwise, a frequency manager 101 may be tasked. It is also to be appreciated that the allocation of a given task, or element thereof, to one or more system components will vary with a given devices computational, processing, data storage/retrieval, communications and other capabilities. Accordingly, the various embodiments of the present disclosure are not to be limited to any given system 100 device performing any given computational task, data storage task, or otherwise.

For at least one embodiment, multiple IoT sensors 102 may be used to provide to the frequency manager(s)/frequency controller(s)/IoT controller(s) 101/107/104 substantially similar or different scan data results. For example, detected signal strengths for the fourth interfering signal 120 may be substantially similar for both the third IoT sensor 102c and the fourth IoT sensor 102d at a given time, such as at time T2. Yet, respective detected signal strengths by these IoT sensors 102c/102d may vary at times both preceding and after time T2. Such scan data results, both those in concurrence and those in disagreement, may be used to determine a direction of travel, speed and other characteristics of a given interfering signal and a signal interference source (SIS), such as those of the fourth interfering signal 124 and the fourth signal interference source 122. Such scan data may be used by the frequency manager/frequency controller 101/104 for any desired purpose. Scan data may be provided, in any desired form, format, or otherwise, in one more scan result reports that are communicated from a given IoT sensor 102 to, respectively, one or more given IoT controllers 104, frequency controllers 107 and frequency managers 101.

Accordingly, it is to be appreciated that various embodiments of the present disclosure may include use of one or more systems configured such that one or more IoT sensors 102 are operated to detect and, when so detected, report to one or more IoT controllers 104 and indirectly to one or more frequency controllers 107 and/or frequency managers 101 data useful for determining one or more of a location of a given signal interference source (SIS) and/or one or more properties and characteristics of a detected interfering signal. The frequency manager(s)/frequency controller(s)/IoT controller(s) 101/107/104 may be configured to use one or more IoT sensors 102 and on any desired basis for any given campaign and scan plan.

For at least one embodiment, a given IoT sensor 102 may be configured for use in interfering signal detection during down-times for that given IoT sensor 102, such as times when the IoT sensor 102 would otherwise not be sensing, processing and/or communicating sensed data to a data server 116. A frequency manager/frequency controller/IoT controller 101/107/104 may be configured to dynamically adjust when an IoT sensor performs operations consistent with one or more campaigns and scan plans and for any given embodiments of the present disclosure. For at least one embodiment, an IoT sensor 102 may be configured into a "light-sleep" whereby it automatically powers-up when a signal having certain characteristics and/or properties (herein, "triggering characteristics") is detected or otherwise present. Such triggering characteristics may be preset, dynamically determined, specified by a frequency manager/frequency controller/IoT controller 101/107/104, determined by a given IoT sensor 102 itself, or otherwise.

Figure 6:
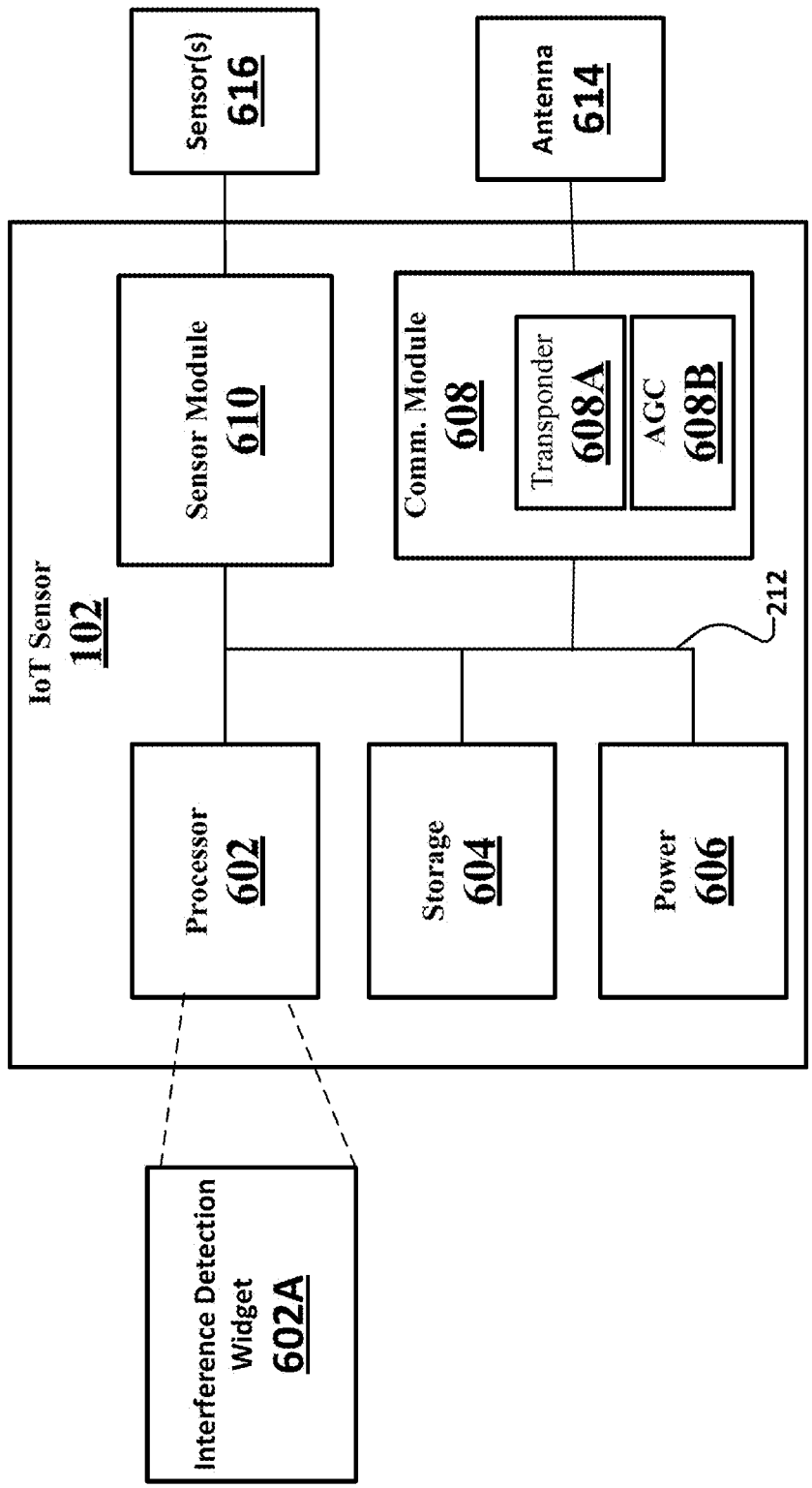
FIG. 6 is a schematic representation of components of an IoT sensor configured for use in identifying an interfering signal and/or a signal interference source and in accordance with at least one embodiment of the present disclosure.

As shown in FIG. 6 and for at least one embodiment of the present disclosure, an IoT sensor 102 may include a hardware processor 602 (hereinafter, the "processor"), a storage module 604, a power module 606, a communications module 608, and a sensor module 610. The communications module 608 may be further configured to include at least one transponder 608A and at least one automatic gain controller (AGC) 608B. Each of these modules may be communicatively coupled to each other and to the processor by a bus 612 or other known or later arising communicative coupling devices, technologies and the like.

The communications module 608 may also be communicatively coupled to one or more internal and/or external antennas 614. The antenna 614 may be static, beam forming, dynamic, or otherwise configured. For example, the antenna 614 may be configured to track a moving signal interference source, such as the fourth signal interference source 118 shown in FIG. 5. The communications module 608 may also be configured to facilitate communicative coupling of a given IoT sensor 102 or, when configured as a relay, two or more IoT sensors with one or more IoT controllers 104 and a data server 116. IoT links 103, data links 116 and/or other communications links may be supported by the communications module and components thereof. One or more of the communications links may include use of the Cloud, a local area network, a wide area network, the Internet, or other communications mediums. One or more servers, Cloud based or otherwise, may also be used to facilitate communication of data between an IoT sensor 102 and an IoT controller 104.

For at least one embodiment, the antenna 614, transponder 608A and/or other known and commonly arising elements of a communications module 608 for an IoT sensor 102 may be configured to support a range of downstream frequencies and listen for signals present across such range of downstream frequencies. When a signal is detected, an AGC 608B may be used to determine a strength of the detected signal. Such detected signal strength may be communicated as scan data to an IoT controller 104 over an IoT link 103.

For at least one embodiment, the value generated by an AGC 608B (herein, the "detected value"), in response to a detected interfering signal, is inversely proportional to the energy received in the detected frequency. The detected interfering signal may arise over any single frequency, a range of frequencies, a band of frequencies or otherwise and is herein referred to commonly as arising over a "frequency band." For at least one embodiment, the AGC 608B may be used for normal IoT sensor 102 communication operations while and/or when being used or not used to detect an interfering signal.

For at least one embodiment, the frequency band of the interfering signal may be identified, for example, based on scan data collected by one or more IoT sensors 102 and/or other data, by a frequency manager 101. Such identification may be based upon any factor, such as a detected anomaly in a given IoT service, in a given wireless communications service, or other frequency range and/or communications service managed by a given frequency manager 101. The frequency band may vary over any given period, for example, such that a range of frequencies are scanned. Such range of frequencies scanned may be specified by the frequency manager 101, per a campaign, and implemented by a frequency controller 107, IoT controller 104 and IoT sensor 102, as per a given scan plan. Data resulting from such campaign and scan plan may be stored, as one or more data sets, in the storage module 604 or elsewhere. Computer instructions (as defined below) for executing one or more scans, performing interfering signal detection, reporting limits and other principles of operation for one or more IoT sensors 102 may also be provided by a frequency controller 107 and/or IoT controller 104 and communicated to one or more of the IoT sensors 102.

For at least one embodiment, the processor 602 may include one or more physical (as compared to logical) components configured for data processing operations. For at least one embodiment, the processor 602 may include one or more hardware processors, such as 32-bit and 64-bit central processing units, multi-core ARM based processors, microprocessors, microcontrollers, and otherwise. The data processing operations executed by the processor 602 may include one or more non-transient computer executable instructions. The non-transient computer executable instructions may include instructions for executing one or more applications, engines, and/or processes configured to perform computer executable operations (hereafter, "computer instructions"). The hardware and software technologies provided by the processor 602 and the computer instructions may arise in any desired computing configuration including, but not limited to, local, remote, distributed, blade, virtual, or other configurations and/or systems configured for use in support of the one or more embodiments of the present disclosure.

The computer instructions may be stored and/or provided in the storage device 604, provided with the processor 602 itself, such as in cache or read only memory, as firmware, accessible from a remote source, or otherwise. The processor 602 may be separated into one or more logical processing elements that execute computer instructions to facilitate the various features and functions of the IoT sensor device 102, as so configured in accordance with one or more embodiments of the present disclosure.

The storage device 604 may be configured to store one or more data sets. Such data sets may be generated based upon actual use of a given IoT sensor 102 or other data provided to or generated by an IoT sensor 102. Such data sets may be provided during an initial set-up and/or initial use of a given IoT sensor 102, may be generated during use of an IoT sensor 102, or otherwise generated/provided and saved in the storage device 604. For at least one embodiment, an IoT sensor 102 may be configured for use with any currently known and/or future arising local, remote, Cloud and/or combinations thereof of one or more storage devices including.

The processor 602 may be configured to execute computer instructions for instantiating an interference detection widget 602A. The interference detection widget 602A may be configured to instruct the IoT sensor 102 to perform one or more of the above described and below described interfering signal detection, SIS location, and/or remediation processes. The interference detection widget 602A may also be configured to instruct the communications module 608 when and how (e.g., at what transmission power, frequency, or otherwise) to communicate a scan result report and scan data to an IoT controller 104 and, when desired, in sequence to one or more of a frequency controller 107 and a frequency manager 101.

For at least one embodiment, an interference detection widget 602A may be instantiated using a local processor, such as on provided with a given IoT sensor 102, a remote processor such as a Cloud based processor, a dedicated processors such as one provided by a frequency manager 101, a frequency controller 107, an IoT controller 104, a data server 114, a combination of any of the foregoing, or otherwise.

For at least one embodiment, an IoT sensor 102 may be configured to instantiate an interference detection widget 602A locally, remotely and/or in combination thereof and using any currently known and/or future arising local, remote, Cloud, and/or combinations thereof of one or more processing devices.

For at least one embodiment, an IoT controller/104 is any device capable of communicating, directly or indirectly, instructions and/or data by and between one or more IoT sensors 102 for the purpose of facilitating the detection of an interfering signal, identification of an SIS, and/or remediation of an interfering. For at least one embodiment, each of a frequency manager 101, frequency controller 107, and IoT controller 104 includes a hardware processor, a data storage component, a communications module, and other common components of servers and is configured to execute computer instructions facilitating at least the operations described herein.

Figure 7:
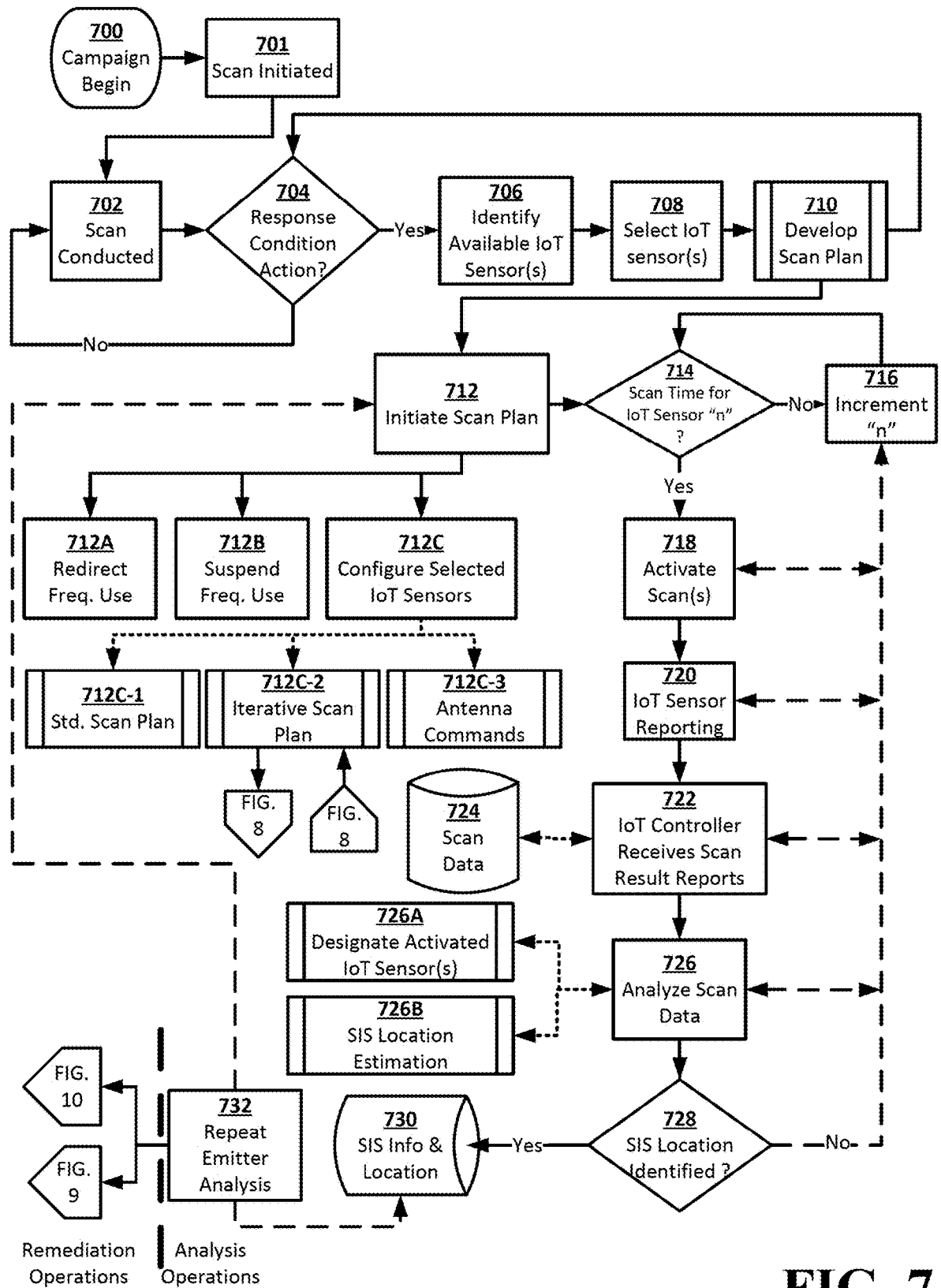
FIG. 7 is a flow chart depicting a process for use in identifying an interfering signal and/or a signal interference source and in accordance with at least one embodiment of the present disclosure.

As shown in FIG. 7 and for at least one embodiment of the present disclosure, a process for facilitating the detecting of an interfering signal begins with a frequency manager 101 requesting a monitoring campaign (Operation 700). The frequency manager 101, requests one or more frequency controllers 104 to initiate a scanning campaign. The request for a scanning campaign may be a for single scan, multiple scans, repeat scans, period scans, or as otherwise desired. A request for a scanning campaign may be triggered automatically, such as when a given RF band is demonstrating decreased performance characteristics, or otherwise. A scan campaign then may continue with an IoT controller 102 initiating a scan. (Operation 701) The scan may be initiated for one or more frequencies or frequency bands, may be initiated over any desired time period, and under any desired conditions. The scan may be initiated for any desired purpose, such as preventive maintenance, in response to a detected system anomaly, or otherwise Per Operation 702, a scan is conducted by one or more controllers 104, using one or more IoT sensors 102, as directed by a frequency controller 107, pursuant to a given scan plan, and in furtherance of a campaign, as specified by a frequency manager 101.

For at least one embodiment, the scan includes a single scan over a desired first frequency band. For at least one embodiment, multiple scans over one or more frequency bands may be performed. Repeat scans over varying or the same time intervals, permutations of the foregoing, combinations of the foregoing, and otherwise may be used. Any desired scanning process may be used in accordance with an embodiment of the present disclosure.

Per Operation 704, one or more the frequency controllers 107 periodically reviews scan results (if any) to determine whether one or more interfering signals have been detected in the one or more first frequency bands, each such detection being identified herein as a "response condition", and whether further action (herein, a "response condition action") is to be performed. It is to be appreciated that for a given scan campaign, a frequency controller 107 may use two or more IoT controllers 104, which are communicatively coupled to and use two or more IoT sensors 102 for any desired scanning During normal operations, a response condition action may be specified by a frequency controller 107 in conjunction with a frequency manager 101. For emergency conditions or during anomalous conditions, one or more of an IoT controller 104 and/or frequency controller 107 may specify a response condition action. For at least one embodiment, consultations with and/or instructions from a frequency manager 101 are not required to specify a response condition action during emergency or anomalous operating conditions.

Detections of other events or conditions (herein, "other conditions") may also occur during any given scan, a description of such other conditions are beyond the scope of the present disclosure, but an embodiment of the present disclosure may be configured to scan, detect and respond to one or more response conditions and/or other conditions. If no response condition action is determined, the process may continue with further scanning, as per Operation 702, the process may be terminated or suspended (not shown in FIG. 7), or may proceed otherwise, as desired for a given embodiment of the present disclosure.

Per Operation 706 and when a response condition action is determined to be performed, for at least one embodiment, the process continues with an identification of two or more IoT sensors 102 and/or other devices that further the response condition action. For at least one embodiment, such identification of IoT sensor(s) 102 is performed by a frequency controller 107. Examples of such other devices include, but are not limited to, WIFI configured devices, neutral host gateways, small cell sites, and other devices. For purposes of simplicity only herein, such IoT sensors 102 and other devices are commonly referred to each as an "available IoT sensor."

For at least one embodiment, the identifying of an available IoT sensor 102 may occur using any known or later arising device lookup, discovery, or other technologies and procedures. For one non-limiting example, a frequency controller 107 may be configured to utilize an IoT sensor database or other database to identify one or more available IoT sensors 102. For other embodiments, a frequency controller 107 may instruct one or more IoT controllers 104 to initiate a query process, such as by broadcasting an "available?" message to one or more IoT sensors 102 within a geographic area of a given response condition. A response to such query by one or more IoT sensors 102 may be used by the frequency controller 107 to identify such responding IoT sensor(s) as being an available IoT sensor.

Per Operation 708, the process may include the frequency controller 107 selecting one or more of the available IoT sensors 102, each of such selected IoT sensors 104 being identified herein for purposes of explanation only as a "selected IoT sensor." More specifically, the frequency controller 107 may be configured to identify and select from the available IoT sensor(s) 102 those one or more IoT sensor(s) 102 that support a scan plan of the one or more first frequency bands, where the one or more first frequency bands may contain, permanently, intermittently, or otherwise, one or more interfering signals giving rise to the given response condition.

Per Operation 710, a scan plan is developed by the frequency controller(s) 107. For at least one embodiment, a scan plan may be developed solely by a frequency controller 107 and/or in conjunction with inputs provided by a frequency manager 101, another frequency controller 107, one or more IoT controllers 104, or combinations thereof. The scan plan may take any form and may include scanning for any desired frequencies bands, including but not limited to the first frequency band and/or frequencies adjacent to those frequencies giving rise to the given response condition. Operations 708-710 may occur iteratively with IoT sensors 102 being selected and the scan plan being developed in view of available IoT sensors 102, the response condition, a response condition action desired, a campaign specified by a frequency manager 101, and other factors. It is to be appreciated that a response condition action desired may also be iteratively determined and a scan plan ultimately developed based upon available IoT sensor 102 characteristics, location, and other considerations. Such other considerations may include a given IoT sensor's availability.

For at least one embodiment, a scan plan may be developed that avoids using an IoT sensor 102, in support of a response condition action, during those time periods during which the given IoT sensor 102 is tasked with performing other operations, such as a scheduled, emergency, or unscheduled activity.

For another embodiment, a scan plan may be developed that avoids using a specific capability of an IoT sensor 102, in support of a response action, that would require use of that specific capability for other uses, such as a scheduled activity, while using other capabilities of the given IoT sensor 102. For a non-limiting example, a use of a given IoT sensor 102 in support of a response condition action may be specified in a scan plan to use only certain frequency bands and during certain time periods. For another non-limiting example, a use of a given IoT sensor 102 per a scan plan may include configuring the IoT sensor 102 such that the use of the IoT sensor 102 has a desired priority, with priorities for other activities (not in support of the scan plan) having greater priority taking precedence. A scan plan may specify the configuring of a use of a given IoT sensor 102 in view of and/or in consideration of other scan plans that may exist with respect to that given IoT sensor 102 and/or with respect to other IoT sensor 102 considerations. Accordingly, it is to be appreciated that for one or more embodiments of the present disclosure, numerous variables and considerations may be considered in developing a scan plan and one size does not fit all.

Per Operation 712 and once the scan plan is determined, at a desired time, the scan plan is initiated. It is to be appreciated that the desired time for initiating a scan plan can be at any time including, but not limited to, immediately, or at some future time. While not shown in FIG. 7, it is to be appreciated that the initiation of a scan plan and subsequent execution of one or more scan plan operations may occur more than once, such as repeatedly, continually, while a response condition exists, within a time period after cessation and/or suspension of a response condition, or otherwise.

Per Operations 712A-712C, one or more scan plan activities may be executed; scan plan activities may arise serially, concurrently, randomly, repeatedly, intermittently, or otherwise, as specified by a given scan plan. Such one or more scan plan activities may arise with respect to one or more selected IoT sensors 102. For at least one embodiment, the frequency controller 107 is responsible for executed a given scan plan and, accordingly, instructs one or more IoT controllers 104 to suitably control one or more IoT sensors 102. Such control of IoT sensors 102 may include controlling active/inactive times, frequencies scanned, and otherwise.

Per Operation 712A, one scan plan activity may include redirecting data, communications links, or other RF signals associated with one or more frequencies used to support normal operations that are coincident with, adjacent to, share harmonics with, or otherwise have signal properties and/or characteristics common with and/or relevant to those of the one or more interfering signals giving rise to the response condition to which a given then response condition action is directed. For one non-limiting example, a scan plan may include a steering sensor data, scan data or other data away from use of an anomalous frequency data to another non-anomalous frequency, where an anomalous frequency is a frequency band impacted, in whole or in part, by an interfering signal. For a further, non-limiting example, in a cellular telecommunications system, traffic may be steered from a 700 MHz frequency band to another distinct frequency band such as an 800 MHz frequency band, and vice versa, when problems on one of the frequency bands arises but is not present on the other frequency band.

Per Operation 712B, one scan plan activity may include suspending use of a given frequency, channel, communications link, or otherwise. Returning to the non-limiting 700 MHz/800 MHz cellular embodiment discussed above, a scan plan activity may include turning off (ceasing emissions from) those 700 MHZ transmitters within a given area with respect to which the given response condition may arise. It is to be appreciated that by turning off such transmitters, an operator or other entity associated with the given response condition action may facilitate further detection (if possible) of one or more interfering signals and identification of a SIS. The SIS may or may not be within the control of a given operator of the frequency manager 101, frequency controller 107, IoT controller 104 and/or IoT sensors 102 used for the given scan plan.

Per Operation 712C, another scan plan activity may include configuring one or more selected IoT sensor(s) 102 in support of the determined scan plan.

Per Operation 712C-1 and for at least one embodiment, a configuring of the one or more selected IoT sensors 102 may include the frequency controller 107 communicating a set of standard commands and/or instructions to the selected IoT sensors 102, via one or more IoT controllers 104, herein a "standard scan command." For at least one non-limiting embodiment, a standard scan command may: be unique to each of the selected IoT sensors 102; be common to two or more of the selected IoT sensors 102; include computer instructions; include data for use with the scan plan; configure a selected IoT sensor 102 to scan one or more specified frequency bands; configure a selected IoT sensor 102 to execute a scan at one or more specified times; specify a minimum scanning; specify a maximum scanning frequency; specify one or more bandwidths and/or bandwidth increments to be scanned; specify sampling periods, intervals and/or durations; and otherwise. For a non-limiting example, a scan command may instruct an IoT sensor 102 to scan from 700 MHz to 750 MHz, in bandwidth increments of 500 kHz and identify any coarse energy peaks arising therein.

For at least one non-limiting embodiment, a "coarse energy peak" is defined herein as an increase of more than 50% (fifty percent) in a then arising received signal strength for a given frequency over an average signal strength for such given frequency, wherein the average signal strength is computed over a pre-determined time interval. For at least one embodiment, the pre-determined time interval is a period of time necessary to communicate a data packet of a given size between a sender and a recipient using the first frequency band. It is to be appreciated that the pre-determined time interval may vary, from embodiment to embodiment, based upon packet size, frequency utilized, modulation and other communications signal transmission processes used.

Per Operation 712C-2, a configuring of the one or more selected IoT sensors 102 may include a frequency controller 107 communicating a set of iterative commands and/or instructions to the selected IoT sensors 102, via one or more IoT controllers 104, herein an "iterative scan command." In addition to properties and/or characteristics of a standard scan command, for at least one non-limiting embodiment, an iterative scan command may include one or more computer instructions which configure an IoT sensor 102 to perform one or more of the Operations shown in FIG. 8.

As shown in FIG. 8 and per Operation 800, an IoT sensor 102, when configured to execute an iterative scan command, may be further configured to identify one or more coarse energy peaks by widely scanning across all or a part of the first frequency band. For one non-limiting example, an IoT sensor 102 may be configured to use a first scan width, such as a scan width of 500 kHz across an entire 700 MHz band.

Per Operation 802, an IoT sensor 102 may be configured to conduct a first narrow scan, using a first narrower scan width, across those one or more frequency bands associated with one or more identified coarse energy peaks detected per Operation 800 (such frequency range herein being identified as a "first narrower frequency band"). For one non-limiting example, the first narrower scan width may use 100 kHz of frequency surrounding one or more of the detected coarse energy peak(s). Such a first narrower scan may be centered about a given detected coarse energy peak, offset from a given coarse energy peak, or otherwise configured. The first narrow scan may return a more precise identification, in the first frequency band, of the one or more detected coarse energy peaks, such more precise identification being referred to herein as a "first narrow coarse energy peak."

Per Operation 804, an IoT sensor 102 may be configured to conduct a second narrow scan, using a second narrower scan width, across those one or more frequency ranges associated with one or more identified coarse energy peaks determined using the first narrower scan per Operation 802. For one non-limiting example, an IoT sensor 102 may be configured to scan 10 kHz of frequency surrounding each of the first narrow scan bands for one or more of the detected coarse energy peaks. Such second narrower scan may be centered about a given detected coarse energy peak, offset from a given coarse energy peak, or otherwise configured. The second narrow scan may return an even more precise identification, in the first frequency band, of the interfering signals, such more precise identification being referred to herein as a "second narrow coarse energy peak."

It is to be appreciated that ever successively third, fourth or other narrower scans may be specified by a frequency controller 107 in a scan plan and used to identify one or more edges of an interfering signal. For at least one embodiment, such narrower scans may facilitate detection of one or more edges of an interfering signal within two scans of a given frequency range. For another embodiment, where a frequency hopping or otherwise varying interfering signal occurs, successively narrower scans may facilitate detection of one or more edges of an interfering signal within a given number of scans of two or more course energy peaks. It is to be appreciated that for at least one embodiment, a number of course energy peaks detected for a given interfering signal, as per Operation 800, may be determinative of a number of narrower scans to be utilized. For at least one non-limiting embodiment, an IoT sensor 102 may be configured to utilize two (2) narrower scans for each course energy peak detected per Operation 800.

Further, it is to be appreciated that iterative scanning may facilitate detection of an interfering signal in an energy efficient manner. For example, if a given IoT sensor 102 is configured, using a standard scanning plan, to scan an entire 100 MHz spectrum, ten thousand (10,000) scans are needed. In contrast and when using an iterative scan plan, an IoT sensor 102 may identify coarse 500 kHz energy peaks of an interfering signal using two-hundred (200) scans, 100 kHz edges for each coarse energy peak in ten (10) scans, and 10 kHz narrower edges in an additional ten (10 scans). That is, edges of a given interfering signal may be found using an iterative scan plan in two-hundred and twenty (220) scans of a given frequency band. Accordingly, use of an iterative scan plan may result in identification of an interfering signal many times faster, and in some cases fifty (50) times faster, than use of a standard scan plan. It is to be appreciated that a corresponding decrease in energy utilized to perform a scan may also be realized from use of an iterative scan plan.

For at least one embodiment, an IoT sensor 102 may be configured to execute an iterative scan plan independently and/or remotely as based upon one or more commands received from the frequency controller 107 communicatively coupled, via an IoT controller 104, to the IoT sensor 102. It is to be appreciated that remote instruction of an iterative scan plan may result in additional reductions in number of scans utilized, energy utilized, and otherwise as one or more of such remote instructions may be generated by the frequency controller 107 based upon results obtained from one or more second IoT sensors 102. Artificial intelligence, machine learning and other data analytics processes may be applied to reduce the number of scan and energy utilized by an array of IoT sensors 102 and in accordance with a given implementation of a response condition action.

Referring again to FIG. 7, per Operation 712C-3, a configuring of the one or more selected IoT sensors 102 may include the frequency controller 107 communicating, via an IoT controller 104, one or more antenna commands to one or more of the selected IoT sensors 102. Antenna commands may be used for IoT sensors 102 that have a configurable and/or directional antenna. A given antenna may be configured to conduct one or more standard scan plans and/or iterative scan plans in one or more quadrants accessible by the configurable and/or directional antenna.

Per Operations 714-716, the process may continue with waiting for a given scan time to arrive for a given IoT sensor 102 and with respect to at least the first frequency band. For at least one embodiment, each IoT sensor 102 designated for use per a given scan plan may be designated by a number or otherwise. IoT sensor numbers may be correspondingly incremented, per Operation 715, until scan times for each IoT sensor 102 designated for a given scan plan are determined. For another embodiment, scan times for each IoT sensor 102 designated for use in a given scan plan may be monitored in parallel for their designated scan times. It is to be appreciated that multiple scan times may be designated for a given IoT sensor 102 and monitoring for such scan times may be performed by the IoT sensor 102 and/or the frequency controller 107 or IoT controller 104. Depending upon whether Operation 714 is performed by an IoT controller 104 or an IoT sensor 102, the process proceeds accordingly with the monitoring device activating the given scanning operations.

Per Operation 718, one or more given scans are activated for a given IoT sensor 102 and in accordance with the then being utilized scan plan. As discussed above, a scan plan may include use of a standard scan plan, an iterative scan plan, a scan plan that includes one or more antenna commands, combinations of the foregoing, and otherwise. Thus, it is to be appreciated that a given activation of scan may include multiple scans, antenna movements, and otherwise.

Per Operation 720, each activated IoT sensor 102 generates a "scan result report." The scan result report may be reported, respectively, to a given IoT controller 104, a frequency controller 107 and a frequency manager 101, to another IoT sensor 102 for compilation, forwarding, further analysis or otherwise, to a network based server, or otherwise reported. A reporting scheme may be designated for a given campaign and a given scan plan. A default reporting scheme may be used. A reporting scheme may vary from IoT sensor 102 to IoT sensor 102 and/or by campaign and/or scan plan then being implemented.

For at least one embodiment, a scan result report may include scan data regarding scan parameters and/or detected elements of an interfering signal (assuming a detection then so occurs) and/or the SIS generating the interfering signal. Such scan data may include, but is not limited to, low frequency and high frequency edges of a detected interfering signal, measurement bandwidth utilized for the given scan to acquire the scan data, power levels detected in the interfering signal, characteristics of any power elements of a detected interfering signals (such as, but not limited to, whether a fixed or varying power is detected, periodicity of any varying signal, power level across steps of a given bandwidth, and otherwise), direction of scan (when available), whether a standard scan plan, an iterative scan plan and/or an antenna sweep scan plan was executed, and any other data, scan settings, or other information relevant to a given implementation of an embodiment of the present disclosure.

Per Operation 722, one or more of the frequency manager 101 specifying the campaign and/or the frequency controller 107 executing the scan plan receives the scan result report(s). One or more frequency managers 101 and/or frequency controllers 107 may receive the scan result reports. For example, a given scan plan may involve the use of multiple IoT sensors 102 that may be respectively communicatively coupled to the same and/or different IoT controllers 104, that are communicatively coupled to one or more frequency controllers 107 executing a scan plan in accordance with a campaign initiated by a frequency manager 101. Accordingly, one or more frequency managers 101, frequency controllers 107, IoT controllers 104, and IoT sensors 102 may be used in a given embodiment with a central or designated frequency manager 101 performing centralized scan data collection and analysis operations.

Per Operation 724, the scan data provided in the received one or more scan result reports, for a given scan plan, may be recorded in a database or storage device, such as storage module 604.

Per Operation 726, the scan data may be analyzed by one or more frequency managers 101 using one or more algorithms, (such as matching algorithms, statistical algorithms, or otherwise), machine learning techniques, artificial intelligence processes, or otherwise. For at least one embodiment, the scan data may be analyzed to identify one or more second frequency bands identified in one or more scan result reports common to one or more of the first frequency bands. The one or more second frequency bands indicative of the presence of an interfering signal in the one or more first frequency bands. The analysis of the scan data may include one or more sub-processes, as shown by Operations 726A and 726B.

Per Operation 726A, one or more IoT sensors 102 may be designated as an "activated IoT sensor" for a given scan plan. Such designation may occur pursuant to a scan plan developed by a frequency controller 107 and activation of such IoT sensor may occur based upon commands communicated from the frequency controller 107 to the IoT sensor 104, via an IoT controller 104. For at least one embodiment, such designation may be based upon results obtained from prior scan plans, an identification of one or more interfering signals by other IoT sensors 102, capabilities of a given IoT sensor 102, characteristics of the detected interfering signal, and otherwise.

Per Operation 726B, an analysis of the scan data may include executing one or more operations for use in estimating a location of the signal interference source (SIS) emitting the given interfering signal. For at least one embodiment, such analysis may occur using one or more of a frequency managers 101. Such frequency manager 101 may be the same or different than those devices initiating a given campaign.

For at least one embodiment, SIS location identifying operations may include comparing power levels reported in two or more scan result reports to identify relative distances of two or more activated IoT sensors 102 to a given SIS. It is to be appreciated that often an activated IoT sensor 102 reporting a highest received power for a given interfering signal will by closest in a direct line of sight distance to the SIS emitting the given interfering signal. Similar relationships may arise with respect to second, third, and other reported interfering signal received strengths, as reported by other activated IoT sensors 102. For at least one embodiment, a frequency manager 101 will know, from a scan result report or other data provided in a database, a location of an activated IoT sensor 102 when the interfering signal is detected—as reported in a given set of scan data. Using known triangulation techniques, a frequency manager 101 may determine an approximate, if not precise, location for a given SIS emitting the interfering signal. It is to be appreciated that with four or more activated IoT sensors 102 providing scan data with respect to a given interfering signal, a precise latitude and longitude for the corresponding SIS may be determinable.

For at least one embodiment, where multiple activated IoT sensors 102 report multiple interfering signals, known circular range estimating techniques may be used, where overlapping regions of each circle indicate, with ever greater precision, a potential area for the location of a given SIS.

For at least one embodiment, a location of a given IoT sensor 102, such as being located inside or outside of a structure, may be used in estimating a location of a SIS. For example, varying attenuation factors may be used in comparing received signal strengths for interfering signals based upon IoT sensor 102 location, with an inside locate IoT sensor 102 having a higher attenuation factor and an outside located IoT sensor 102 having a lower attenuation factor. Such attenuation factors may have an inverse relationship with a given received signal strength for an interfering signal. An attenuation factor used for a given IoT sensor 102 may be determined based upon testing, based on results reported in scan result reports, based upon statistical analysis, based upon a designated location of a given IoT sensor 102, combinations of any of the foregoing, or otherwise.

For at least one embodiment, ray tracing data may be used by a frequency manager 101 to identify a given SIS. For example, if four (4) IoT sensors 102 have line of site to a given SIS and one IoT sensor 102 is receiving multipath energy, a frequency manager 101 may use the scan data to detect that condition and use ray tracing techniques to identify a location of an SIS. It is to be appreciated that an identification of a location of an SIS may be accomplished with any acceptable error range. Such acceptable error range may vary by embodiment and implementation of any given embodiment.

For at least one embodiment wherein a mobile IoT sensor 102 is utilized, one or more of such mobile IoT sensors 102 may be deployed into a given area within which an interfering signal has been detected and/or may be occurring. Such one or more mobile IoT sensors 102, in conjunction with one or more frequency managers/frequency controllers/IoT controllers 101/107/104, may be used to detect and identify a location for a given SIS using one or more of the above described operations. It is to be appreciated that interfering signal characteristics and SIS location determinations may be possible when using a mobile IoT sensor 102 that may not be possible using fixed IoT sensors 102 by repositioning the mobile IoT sensor 102, as desired, to provide further data useful for triangulation and other position determining techniques, any of which may be used for any given embodiment of the present disclosure. For at least one embodiment, a mobile IoT sensor 102 may be provided in a drone, a vehicle, or otherwise. Directional antennas may be used with a mobile IoT sensor 102, as desired for a given embodiment. Use of a drone, vehicle or otherwise as a mobile IoT sensor 102 may be configured such that such use for purposes herein does not interfere with other primary operations of such drone, such as delivery, photography, surveillance, or otherwise.

Per Operation 728, an SIS location may be determined based upon one or more iterations of Operations 718, 720, 722, 724 and 726. It is to be appreciated that such iterative operations may arise at any time and with any repetitions, as visually represented by the dashed lines connecting Operations 718, 720, 722 and 726, with an increment in the designated IoT sensor 102, as needed, per Operation 716. That is, one or more of the above Operations may occur serially, in parallel, or otherwise with respect to detecting an interfering signal by one or more IoT sensors 102 and determining a location (estimated or otherwise) of a SIS for such detected interfering signal. Further, one or more of such Operations may be repeated by a given IoT sensor 102, such as where multiple scans, or multiple scan result reports are desired to be generated and in accordance with a given scan plan.

Per Operation 730, when determined, a location and/or other information for a given SIS may be stored in the database. The database may be periodically updated with any available information regarding an SIS. Such data may be obtained from any of the data, processes and/or results obtained using one or more Operations of FIG. 7, from external sources, or otherwise.

Per Operation 732, an analysis may be conducted by a frequency manager 101 as to whether a given SIS is a "repeat emitter." Such repeat emitter analysis may be performed based, at least in part, on the previously stored information, using machine learning algorithms, and other known data analysis techniques. As shown by the dashed line connecting Operation 732 with Operation 730, determination of a given SIS as a repeat emitter may involve an iterative process.

As shown, detection operations for a given interfering signal and identification of a location and/or other information for the interfering signal emitting SIS (collectively, "analysis operations") may be deemed complete for that given time period and for a given scan plan. Additional analysis operations may be performed later if desired or otherwise specified in a scan plan. Accordingly, Operations may resume at Operation 712 or otherwise, as illustrated by the dashed line connecting Operations 732 and 712.

Figure 9:
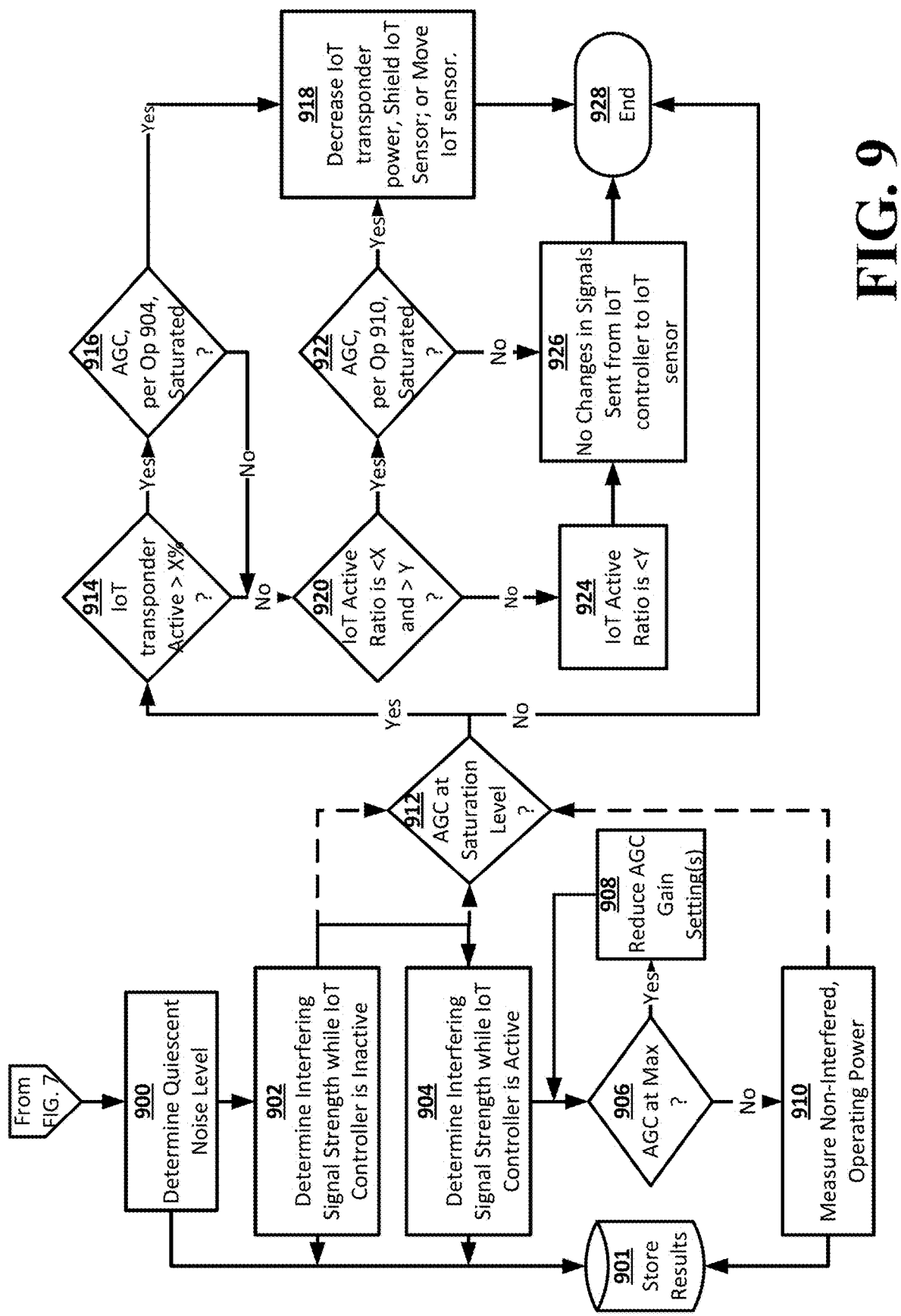
FIG. 9 is a flow chart depicting a first remediation process for an interfering signal and in accordance with at least one embodiment of the present disclosure.

As shown and in view of the above described one or more analysis operations, one or more "remediation operations" may be performed. One or more such remediation operations are illustrated in FIG. 9 and FIG. 10 for at least one embodiment of the present disclosure. Further, and not shown in a drawing figure, a remediation operation may include a frequency manager 101 calculating changes in a given interfering signal at an IoT sensor 102 and/or at a geographic boundary if changes, such as power gain/reduction, are made to a SIS. Accordingly, it is to be appreciated that other forms of remediation operations may be performed and that the various embodiments of the present disclosure are not limited to the remediation operations described herein.

Per Operation 900, a remediation operation may include a frequency controller 107 instructing an IoT sensor 102, via an IoT controller 104, to determine a quiescent noise level. For at least one embodiment, such determination may be accomplished by powering down one or more, if not all, transmitters associated with one or more of the frequency manager 101, frequency controller 107, IoT controller 104, other IoT sensors 102, or other known devices using a given frequency and/or frequency band. For at least one embodiment, any other transmitters known and external to the given IoT sensor 102 (when possible) may be powered down such that minimal RF signals (if possible) are receivable by the transponder in the given IoT sensor 102.

It is to be appreciated that in many implementations, powering down all known and/or many known transmitters may not be feasible. For such conditions, those transmitters not powered down may be considered to be contributing to the quiescent noise floor level and such measurements may be made in view thereof. It is further to be appreciated that a determination of the quiescent noise level may be accomplished iteratively, with various known transmitters being powered up or down, at various times. Further, the quiescent noise level may be determined over two or more frequency bands and in accordance with any desired number and/or types of modulation schemes, frequency use schemes, or otherwise. Thus, the determining of a quiescent noise level may involve numerous measurements, numerous samples, statistical analysis of the same, may be frequency band specific, and may involve other known signal processing and characterization type operations. For at least one embodiment, any known or later arising technique for determining a quiescent noise level for a given IoT sensor 102 may be used.

Per Operation 902, a remediation operation may include taking one or more AGC 608B power level measurements when the known interfering signal is present but while the frequency manager 101, frequency controller 107, IoT controller 104, other IoT sensors 102, or other known devices are not communicating with the given IoT sensor 102. It is to be appreciated that a transponder 608A may be configured to utilize any desired communications technology. Non-limiting examples of such communications technologies include LoRaWAN®, NB-IOT, SigFox, and similar presently available and/or later arising technologies. For at least one embodiment and under such test conditions, a minimum value output by an AGC 608B represents a worst case headroom in the AGC 608B for any LoRaWAN or similar communications signals.

Per Operation 904, a remediation operation may include taking one or more AGC 608B power level measurements when a combined signal is received and the combined signal includes energy from the known interfering signal and energy from an actively transmitting frequency manager 101, frequency controller 107, IoT controller 104, other IoT sensors 102, or other known devices. For at least one embodiment and under such test conditions, a minimum value output by an AGC 608B represents a worst case power level of the combined signals.

Per Operation 906, a remediation operation may include determining whether the AGC 608B is at a maximum value or another pre-determined value when both the interfering signal is present and the frequency manager 101, frequency controller 107, IoT controller 104, other IoT sensors 102, or other known devices are actively communicating with the given IoT sensor 102. If "yes," the process may proceed to Operation 908. If "no," the process may proceed to Operation 910.

Per Operation 908, a remediation operation may include reducing one or more gain settings for the AGC 608B. An amount of such reduction may be specified by the frequency manager 101, the frequency controller 107, the IoT controller 104, the IoT sensor 102 itself, or other known devices. Reductions of the gain settings may occur iteratively, stepwise, in one step, or otherwise. Reductions may occur until any desired level for the AGC 608B is reached. Such level may be pre-determined or determined on a then occurring basis.

Per Operation 910, a remediation operation may include taking one or more AGC 608B power level measurements when the known interfering signal is not present and while the frequency manager 101, frequency controller 107, IoT controller 104, another IoT sensor 102, or other known device is transmitting a communication signal to the given IoT sensor 102. For at least one embodiment, minimum and maximum AGC 608B power level measurements detected during Operation 910 represent a range of AGC values the IoT sensor 102 may expect to detect when the frequency manager 101, frequency controller 107, IoT controller 104, another IoT sensor 102, or other known device is actively transmitting signals to the IoT sensor 102.

For at least one embodiment, additional remediation operations may be performed based upon detected AGC levels. These additional remedial operations are identified herein as Operations 912-926. One or more of such additional remediation operations may be performed in conjunction with one or more of Operations 902-910.

Per Operation 912, an additional remediation operation may include determining whether the AGC 608B level is at saturation. If "no", then no additional remediation operations are performed, and the process may end per Operation 928. If "yes," the additional remediation operations may proceed with Operation 914.

Per Operation 914, an additional remediation operation may include determining a ratio of when the IoT sensor's transponder is receiving signals from the frequency manager 101, frequency controller 107, IoT controller 104, other IoT sensors 102, or other known devices and whether the received signal strength ratio is greater than a first threshold "X." For at least one embodiment, "X" is a pre-determined value. For at least one embodiment, X=75% (seventy-five percent). If "yes," the process may proceed to Operation 916. If "no," the process may proceed to Operation 920.

Per Operation 916, an additional remediation operation may include determining if the power level measurements taken during Operation 904 indicate that the AGC 608B is saturated. If "yes", the process may proceed to Operation 918. If "no", the process may proceed to Operation 920.

Per Operation 918, an additional remediation operation may include one or more of reducing the output power of the communications signals sent from a frequency manager 101, frequency controller 107, IoT controller 104, another IoT sensor 102, or other known device to a given IoT sensor's transponder, shielding the IoT sensor 102 from the interfering signal, moving the IoT sensor 102 away from the SIS for the given interfering signal, or other actions which diminish the amount of RF signal energy received by the transponder for that given IoT sensor 102. The process may proceed to Operation 928.

Per Operation 920, an additional remediation operation may include determining a ratio of when the transponder for the given IoT sensor 102 is active and whether such ratio is less than the first threshold "X" and greater than a second threshold "Y." For at least one embodiment, "Y" is a pre-determined value. For at least one embodiment, Y=1% (one percent). If "yes," the process may proceed to Operation 922. If "no," the process may proceed to Operation 924.

Per Operation 922, an additional remediation operation may include determining if the power level measurements taken during Operation 910 for the maximum values are met. If "yes", the process may proceed to Operation 918. If "no", the process may proceed to Operation 926.

Per Operation 924, an additional remediation operation may include determining that the on/off ratio for transponder for the given IoT sensor 102 is less than the second threshold "Y." Accordingly, the process may proceed to Operation 926.

Per Operation 926, no changes in the output power of communications signals sent by a frequency manager 101, frequency controller 107, IoT controller 104, other IoT sensor 104, or other known device to a given IoT sensor 102 are needed, and the process may proceed to Operation 928.

Per Operation 928, the process ends.

As shown in FIG. 10, a second series of remedial operations may be additionally and/or separately performed. As per Operation 1000, a remedial operation may include calibrating a given IoT sensor 102 and mapping one or more AGC 608B values of such given IoT sensor 102 to one or more energy levels. It is to be appreciated that such calibration and mapping operations may be performed by a frequency manager 101, in a laboratory, manufacturing or other controlled environment setting, in the field, or otherwise. For example, a given AGC 608B value (for example, 90% (ninety percent)) for a given IoT sensor 102 may be associated with a given spreading factor (for example, an SF10 factor) and correlated to a given signal strength (for example, −40 dBm). A range of AGC values can be calibrated and stored in a database.

Per Operation 1002, a second quiescent AGC value may be gathered. The second quiescent AGC value may represent energy received by a given IoT sensor 102 from all other transmitters, besides a given frequency manager 101, frequency controller 107, IoT controller 104, other IoT sensors 102 and/or other known devices.

Per Operation 1004, a transmitter in the SIS (in question) may be activated and the value of the AGC in the IoT sensor 102 receiving the interfering signal from the SIS may be measured.

Per Operation 1006, a difference between the results obtained per Operation 1002 and Operation 1004 may be calculated and represents the power received by the IoT sensor 102 from the given SIS.

Per Operation 1008, readings from multiple IoT sensors 102 near a geographic boundary for a given interfering signal may be obtained, for example using per Operations 1000-1006, and the energy being transmitted by the given SIS may be extrapolated.

Per Operation 1010, the energy transmitted by the given SIS, as determined per Operation 1008, may be used to adjust one or more AGC levels in one or more IoT sensors 102. Such adjustments may be accomplished using one or more of Operations 914-926 or otherwise. The second series of remedial operations is then complete.

It is to be appreciated that the operations described above and depicted in FIGS. 7-10 are illustrative only and are not intended herein to occur, for all embodiments of the present disclosure, in the order shown, in sequence, or otherwise. One or more operations may be performed in parallel and operations may be not performed, as provided for any given use of an embodiment of the present disclosure.

Although various embodiments of the claimed invention have been described above with a certain degree of particularity, or with reference to one or more individual embodiments, those skilled in the art could make numerous alterations to the disclosed embodiments without departing from the spirit or scope of the claimed invention. The use of the terms "approximately" or "substantially" means that a value of an element has a parameter that is expected to be close to a stated value or position. However, as is well known in the art, there may be minor variations that prevent the values from being exactly as stated. Accordingly, anticipated variances, such as 10% differences, are reasonable variances that a person having ordinary skill in the art would expect and know are acceptable relative to a stated or ideal goal for one or more embodiments of the present disclosure. It is also to be appreciated that the terms "top" and "bottom", "left" and "right", "up" or "down", "first", "second", "next", "last", "before", "after", and other similar terms are used for description and ease of reference purposes only and are not intended to be limiting to any orientation or configuration of any elements or sequences of operations for the various embodiments of the present disclosure. Further, the terms "coupled", "connected" or otherwise are not intended to limit such interactions and communication of signals between two or more devices, systems, components or otherwise to direct interactions; indirect couplings and connections may also occur. Further, the terms "and" and "or" are not intended to be used in a limiting or expansive nature and cover any possible range of combinations of elements and operations of an embodiment of the present disclosure. Other embodiments are therefore contemplated. It is intended that all matter contained in the above description and shown in the accompanying drawings shall be interpreted as illustrative only of embodiments and not limiting. Changes in detail or structure may be made without departing from the basic elements of the invention as defined in the following claims.

What is claimed is:

1. A process, for identifying and detecting a mobile interfering signal, comprising:
   instructing, by a frequency manager, an Internet-of-Things ("IoT") controller to perform operations for detecting a Mobile Signal Interference Source ("MSIS") comprising:
   conducting a scan of one or more frequency bands to obtain at least one scan result;
   determining, from the at least one scan result, if an interfering signal has been detected;
   if the interfering signal has been detected:
   identifying two or more IoT sensors as available IoT sensors;
   selecting from the available IoT sensors a first IoT sensor;
   developing a scan plan;
   instructing the first IoT sensor to initiate the scan plan;
   receiving first scan data from the first IoT sensor;
   identifying, based on the first scan data, a first property for a first characteristic for the interfering signal;
   receiving second scan data from the first IoT sensor;
   identify, based on the second scan data, a second property for the first characteristic for the interfering signal;
   determining whether the first property and the second property for the first characteristic differ; and
   when "Yes," designating the interfering signal as arising from a potential MSIS.

2. The process of claim 1,
   wherein the first characteristic is a detected signal strength for the interfering signal.

3. The process of claim 1, further comprising:
   selecting from the available IoT sensors, a second IoT sensor;
   instructing the second IoT sensor to initiate the scan plan;
   receiving third scan data from the second IoT sensor;
   analyzing the third scan data to determine if the interfering signal is present in the third scan data;
   when "Yes,",
   identifying a third property for the first characteristic for the interfering signal;
   receiving fourth scan data from the second IoT sensor;
   analyzing the fourth scan data to identify a fourth property for the interfering signal;
   determining whether the third property and the fourth property for the first characteristic differ; and
   when "Yes," designating the interfering signal as arising from a determined MSIS.

4. The process of claim 3, further comprising:
   determining a first location of the MSIS based on a difference between the first property and the third property; and
   determining a second location of the MSIS based on a difference between the second property and the third property.

5. The process of claim 3, further comprising:
   determining a direction of travel of the MSIS based on a difference between the first property and the second property; and
   determining a speed of the MSIS based on a difference between the third property and the fourth property.

6. The process of claim 3,
   wherein the first scan data and the third scan data are received substantially simultaneously; and
   wherein the second scan data and the fourth scan data are received substantially simultaneously and after receipt of the first scan data.

7. The process of claim 6, further comprising:
   analyzing at least one of the first property in view of the second property and the third property in view of the fourth property to determine a direction of travel for the MSIS.

8. The process of claim 7, further comprising:
   selecting, based on the direction of travel, from the available IoT sensors, a third IoT sensor;
   identifying, a third IoT sensor as an available sensor;
   generating an updated scan plan that includes the third IoT sensor;
   instructing the third IoT sensor to implement the updated scan plan;
   receiving fifth scan data from the third IoT sensor;
   analyzing the fifth scan data identify a fifth property for the first characteristic for the interfering signal;
   receiving sixth scan data from the third IoT sensor;
   analyzing the sixth scan data identify a sixth property for the first characteristic for the interfering signal; and
   determining a direction of travel and a speed for the MSIS based on a first location of the MSIS, a second location of the MSIS, and a comparison of the fifth property with the sixth property.

9. The process of claim 1, further comprising:
   instructing the first IoT sensor to continually scan for the interfering signal;
   instructing a second IoT sensor to continually scan for the interfering signal; and
   instructing a third IoT sensor to continually scan for the interfering signal.

10. A process, for remediating an interfering signal from a Signal Interference Source ("SIS"), comprising:
    instructing, by an Internet-of-Things ("IoT") frequency controller, a first IOT sensor to determine a quiescent noise level;
    detecting, by the first IoT sensor, an interfering signal;
    measuring, by the first IoT sensor, a first power level for the interfering signal;
    measuring, by the first IoT sensor, a second power level for a combined signal;
    wherein the combined signal includes signals received from the interfering signal and one or more IoT components;
    determining if the second power level equals a predetermined value;
    if "Yes," reducing one or more gain settings used in measuring the second power level until the second power level is less than the predetermined value; and
    measuring, by the first IoT sensor and while the interfering signal is not detected, one or more third power levels;
    wherein the one or more third power levels indicate at least a minimum power level and a maximum power level the first IoT sensor may detect when one or more IoT components are actively transmitting one or more signals to the IoT sensor; and wherein the one or more IoT components include at least one of a frequency manager, the IoT frequency controller, and another IoT sensor.

11. The process of claim 10,
wherein the instructing of the first IoT sensor to determine the quiescent noise level further comprises:
   powering down transmitters for the one or more IoT components; and
   measuring radio frequency signals received by the first IoT sensor while the transmitters for the one or more IoT components are powered down.

12. The process of claim 11,
wherein the first power level for the interfering signal is obtained while the one or more IoT components are not communicating with the first IoT sensor.

13. The process of claim 10,
wherein the first IoT sensor includes an Automatic Gain Controller ("AGC"); and
wherein the predetermined value is a maximum power level setting for the AGC.

14. The process of claim 13, further comprising:
determining if the AGC is saturated;
if the AGC is saturated,
   determining a first threshold indicative of a received signal strength when one or more IoT components are actively transmitting to the first IoT sensor and a transponder in the first IoT sensor is inactive;
   determining whether a first ratio of a currently received signal strength is greater or less than the first threshold;
   when the first ratio is less than the first threshold,
      determining if a second ratio for when the transponder in the first IoT sensor is active is greater than a second threshold; and
      when the second ratio is greater than the second threshold,
         determining if a current power level for the AGC is greater than the maximum power level setting for the AGC;
         when the current power level is greater than the maximum power level, implementing at least one of one or more remediation options;
         determining whether the AGC is saturated at the second power level;
   when the first ratio is greater than the first threshold,
      determining if the AGC is saturated at the first power level; and
         when the AGC is saturated at the first power level, implementing at least one of the one or more remediation options.

15. The process of claim 14,
wherein the one or more remediation options include:
   reducing an output power signal for at least one of the IoT components;
   shielding the first IoT sensor from the interfering signal;
   moving the first IoT sensor away from a source of the interfering signal; and
   diminishing an amount of radio frequency signal energy received by the first IoT sensor.

16. The process of claim 14,
wherein the first threshold is seventy-five percent (75%).

17. The process of claim 14,
Wherein the second threshold is one percent (1%).

18. The process of claim 14,
wherein the one or more remediation options include:
   measuring a quiescent AGC value;
   activating the SIS;
   measuring, while the SIS is active, an SIS active value for the AGC;
   determining a signal strength power difference between the quiescent AGC value and the SIS active value; and
      wherein the signal strength power difference represents a radio frequency signal power received from the SIS;
   adjusting, based on the signal strength power difference, the AGC level in the first IoT sensor.

19. The process of claim 18,
wherein the one or more remediation options include:
   obtaining multiple AGC values by multiple IoT sensors located near a geographic boundary for the SIS; and
   extrapolating from the multiple AGC values a radio frequency signal strength for the SIS.

20. The process of claim 19, further comprising:
adjusting at least one AGC level in another IoT sensor based on the signal strength power difference determined by the first IoT sensor.

* * * * *